United States Patent
Sekito

(10) Patent No.: US 8,993,897 B2
(45) Date of Patent: Mar. 31, 2015

(54) PHOTOSENSITIVE RESIN COMPOSITION AND USE THEREOF

(75) Inventor: Yoshihide Sekito, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 14/113,541

(22) PCT Filed: Apr. 24, 2012

(86) PCT No.: PCT/JP2012/060978
§ 371 (c)(1),
(2), (4) Date: Oct. 23, 2013

(87) PCT Pub. No.: WO2012/147745
PCT Pub. Date: Nov. 1, 2012

(65) Prior Publication Data
US 2014/0069702 A1    Mar. 13, 2014

(30) Foreign Application Priority Data

Apr. 25, 2011 (JP) ................................ 2011-097507

(51) Int. Cl.
*H04K 1/00* (2006.01)
*C08F 290/06* (2006.01)
(Continued)

(52) U.S. Cl.
CPC ............ *G03F 7/035* (2013.01); *C08F 290/067* (2013.01); *C09D 5/18* (2013.01);
(Continued)

(58) Field of Classification Search
USPC ............. 174/258; 399/328, 350; 427/58, 402; 428/141, 323, 331; 430/14, 109.3, 138; 501/136
See application file for complete search history.

(56) References Cited

U.S. PATENT DOCUMENTS

2003/0122371 A1 * 7/2003 Rochford et al. ............. 283/101
2004/0197524 A1 * 10/2004 Rochford et al. ............. 428/143
(Continued)

FOREIGN PATENT DOCUMENTS

| JP | 9-137109 | 5/1997 |
| JP | 2000-241969 | 9/2000 |
| JP | 2010-139559 | 6/2010 |

OTHER PUBLICATIONS

English translation of International Preliminary Report on Patentability, International Application No. PCT/JP2012/060978, mailed Nov. 7, 2013.

(Continued)

*Primary Examiner* — Xiaoliang Chen
(74) *Attorney, Agent, or Firm* — Kagan Binder, PLLC

(57) ABSTRACT

The photosensitive resin composition contains a (A) binder polymer, (B) cross-linked polymer particles, (C) thermosetting resin, (D) photo-polymerization initiator, and a (E) phosphoric flame retardant, in which a content of the (B) cross-linked polymer particles is 30 parts by weight to 100 parts by weight with respect to the 100 parts by weight of the (A) binder polymer, and an average particle diameter of the (B) cross-linked polymer particles is 1 μm to 10 μm. Therefore, the photosensitive resin composition (i) obtains an excellent tack-free property after being applied and dried, (ii) can be subjected to fine processing, (iii) is formed into a cured film having excellent flexibility, flame retardancy, and electrical insulation reliability, and (iv) causes a substrate to have a small warpage after being cured.

18 Claims, 1 Drawing Sheet

(51) Int. Cl.
*C09D 5/18* (2006.01)
*G03F 7/033* (2006.01)
*G03F 7/035* (2006.01)
*G03F 7/037* (2006.01)
*G03F 7/038* (2006.01)
*H05K 1/03* (2006.01)
*H05K 3/28* (2006.01)

(52) U.S. Cl.
CPC ............... *G03F 7/033* (2013.01); *G03F 7/037* (2013.01); *G03F 7/038* (2013.01); *G03F 7/0388* (2013.01); *H05K 1/0373* (2013.01); *H05K 3/287* (2013.01); *H05K 2201/012* (2013.01)
USPC ............. 174/258; 399/328; 399/350; 427/58; 427/402; 428/141; 428/323; 428/331; 430/14; 430/109.3; 430/138; 501/136

(56) References Cited

U.S. PATENT DOCUMENTS

| | | | | |
|---|---|---|---|---|
| 2004/0232813 | A1* | 11/2004 | Nakano et al. | 313/112 |
| 2005/0158088 | A1* | 7/2005 | Someya et al. | 399/328 |
| 2006/0088349 | A1* | 4/2006 | Someya et al. | 399/328 |
| 2008/0300350 | A1* | 12/2008 | Ohno et al. | 524/147 |
| 2009/0312519 | A1* | 12/2009 | Uera et al. | 528/322 |
| 2010/0196822 | A1* | 8/2010 | Sasaki et al. | 430/280.1 |
| 2013/0264099 | A1* | 10/2013 | Sekido et al. | 174/250 |

OTHER PUBLICATIONS

Search Report, International Application No. PCT/JP2012/060978, May 29, 2012.

* cited by examiner

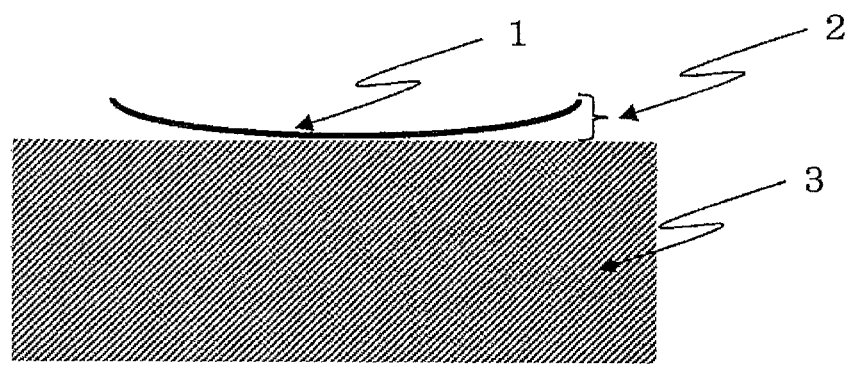

PHOTOSENSITIVE RESIN COMPOSITION AND USE THEREOF

This application claims benefit from International Application No. PCT/JP2012/060978, which was filed on Apr. 24, 2012, which in turn claims priority to Japanese Application No. 2011-097507, which was filed on Apr. 25, 2011, wherein the entireties of said patent applications are incorporated herein by reference.

TECHNICAL FIELD

The present invention relates to (A) a photosensitive resin composition which (i) has excellent tack-free property after being applied and dried, (ii) can be subjected to fine processing because the photosensitive resin composition has photosensitivity, (iii) is formed into a cured film having excellent flexibility, flame retardancy, and electrical insulation reliability, and (iv) causes a substrate to have small warpage after being cured, (B) a resin film, (C) an insulating film, and (D) an printed wiring board provided with an insulating film.

BACKGROUND ART

Polyimide resin is widely used for electric and electronic purposes because the polyimide resin has an excellent heat resistance, electrical insulation reliability, chemical resistance, and mechanical property. For example, the polyimide resin is used for forming (A) insulating films and protective coating agents onto semiconductor devices, (B) base materials and surface protective materials of flexible circuit substrates, integrated circuits, etc., and (C) interlayer insulating films and protective films of extremely small circuits.

There has been used a cover lay film particularly as a surface protective material for flexible circuit substrates, which cover lay film can be obtained by applying an adhesive to a molding product such as a polyimide film. The cover lay film is adhered to a flexible circuit substrate generally by securing an opening by means of punching etc. in advance at a bonding portion between the cover lay film and a terminal portion or component of a circuit, aligning the opening and the cover lay film with each other, and subjecting the cover lay film and the flexible circuit substrate to thermocompression bonding with use of a thermal press etc.

It is, however, difficult to secure an opening in a thin cover lay film with a high accuracy, and the alignment to bond the cover lay film and the flexible circuit substrate to each other is usually carried out manually. This causes insufficiently accurate alignment, low workability at the time of bonding, and high costs.

Meanwhile, a solder resist or the like is also used as a surface protective material for circuit substrates, and, particularly, a solder resist having a photosensitivity function is preferably used in the case where a fine processing is necessary. Such a photosensitive solder resist is made from a photosensitive resin composition mainly containing acid-modified epoxy acrylate, epoxy resin, etc. The photosensitive solder resist has an excellent electrical insulation reliability as an insulating material. However, the photosensitive solder resist has a bad mechanical property such as flexibility, and is largely shrunk when being cured. Therefore, a warpage of a circuit substrate becomes large in the case where the photosensitive solder resist is laminated onto a thin and flexible circuit substrate such as a flexible circuit substrate. This makes it difficult to use a photosensitive solder resist for flexible circuit substrates. The photosensitive solder resist has poor flame retardancy, and therefore, in the case where a flame retardant is added to the photosensitive solder resist to apply flame retardancy, the photosensitive solder resist causes problems such as (i) reduction in physical property and (ii) a contact fault and contamination during processes, each of which is caused by bleeding out which is a phenomenon that a flame retardant is soaked out of a cured film.

There have been proposed various photosensitive solder resists which can exhibit flexibility and flame retardancy.

For example, Patent Literature 1 discloses a photosensitive resin composition which (i) has excellent flexibility, excellent solder heat resistance, high sensitivity, and high resolution, and (ii) can makes it easy to form a fine pattern on a heat-resistant protective film.

One of important properties in the case where a photosensitive solder resist is processed is a tack-free property, i.e., low tackiness of a surface after the surface is applied with a material of a film and a solvent is dried. The high tack-free property is an important property because the high tack-free property (i) prevents a photomask, which is necessary for forming a fine pattern, from adhering to a surface of an applied film to thereby contaminate the surface in the case where the photomask is provided on the surface of the applied film and the surface is radiated by ultraviolet rays, and (ii) prevents circuit substrates from adhering to each other in the case where the circuit substrates applied with films which have not been radiated yet with ultraviolet rays are stacked on one another.

As a method for improving the tack-free property after the photosensitive solder resist is applied and dried, there employs a method of adding inorganic fillers to cause an applied film to have a rough surface. The method, however, has problems in that a cured film becomes weak because the inorganic fillers are hard, cracking occurs, and the cured film is peeled off from a base material.

In view of the circumstances, for example, Patent Literature 2 discloses a high performance ink composition for use in a photo-curable liquid solder resist, which (A) has a high sensitivity, (B) has excellent tack-free and excellent developing properties when the ink composition is applied, and (C) does not decrease adhesiveness or is not peeled off due to cracking or/and volumetric shrinkage.

CITATION LIST

Patent Literatures

Patent Literature 1
Japanese Patent Application Publication, Tokukai, No. 2000-241969 A (Publication date: Sep. 8, 2000)
Patent Literature 2
Japanese Patent Application Publication, Tokukaihei, No. 9-137109 A (Publication date: May 27, 1997)
Patent Literature 3
Japanese Patent Application Publication, Tokukai, No. 2010-139559 A (Publication date: Jun. 24, 2010)

SUMMARY OF INVENTION

Technical Problem

The above Patent Literatures propose various methods for solving problems of photosensitive solder resists.

Although the photosensitive resin composition disclosed in Patent Literature 1 is excellent in sensitivity, resolution, folding endurance, and flame retardancy because the photosensitive resin composition contains an urethane compound and aromatic phosphate ester which has an ethylene unsaturated bond and has a flexible skeleton, the photosensitive resin composition has a poor electrical insulation reliability, bleeding out from a cured film, and a poor tack-free property because of stickiness when the photosensitive resin composition is applied and dried.

In the case of the ink composition for a solder resist disclosed in Patent Literature 2, polymer fine particles having a glass transition temperature of 20° C. or less are dispersed. Therefore, the ink composition has an excellent tack-free property in the case where the ink composition is applied. This makes it possible to suppress reduction in adhesion and/or peeling off due to cracking and/or volumetric reduction. In the case where the ink composition is used as an insulating protective film of a flexible printed wiring board, however, the ink composition has problems in that a resultant insulating protective film has poor folding endurance and flame retardancy and is largely warped.

A radiation-sensitive resin composition described in Patent Literature 3 is excellent in flexibility and flame retardancy because the radiation-sensitive resin composition has a carboxyl group and a hydroxy group, and contains cross-linked polymer particles having a glass transition temperature of 0° C. or less and a polymerizable compound containing phosphorus. The radiation-sensitive resin composition, however, has a poor tack-free property because of stickiness when the radiation-sensitive resin composition is applied and dried.

Solution to Problem

The inventors of the present invention have been diligently examined to solve the problems. As a result, the inventors obtained such a knowledge that a photosensitive resin composition, which (i) has an excellent tack-free property after the photosensitive resin composition is applied and dried, (ii) can be subjected to fine processing, and (iii) is formed into a cured film excellent in flexibility, flame retardancy, and electrical insulation reliability, and (iv) causes a substrate to have a small warpage after being cured, a resin film, an insulating film, and a printed wiring board provided with an insulating film, are obtained from a photosensitive resin composition including at least: (A) binder polymer; (B) cross-linked polymer particles; (C) thermosetting resin; (D) photo-polymerization initiator; and (E) phosphoric flame retardant, content of the (B) cross-linked polymer particle being 30 parts by weight to 100 parts by weight with respect to the 100 parts by weight of the (A) binder polymer, and the (B) cross-linked polymer particles having an average particle diameter of 1 μm to 10 μm. Based on the knowledge, the inventors achieved the present invention. The present invention can solve the above problems by using a photosensitive resin composition having a new feature below.

That is, the subject invention is a photosensitive resin composition containing at least: (A) binder polymer; (B) cross-linked polymer particles; (C) thermosetting resin; (D) photo-polymerization initiator; and (E) phosphoric flame retardant, content of the (B) cross-linked polymer particle being 30 parts by weight to 100 parts by weight with respect to the 100 parts by weight of the (A) binder polymer, and the (B) cross-linked polymer particles having an average particle diameter of 1 μm to 10 μm.

Further, in the photosensitive resin composition in accordance with the subject invention, it is preferable that the (A) binder polymer contain (A1) resin having a urethane bond in its molecule.

Further, in the photosensitive resin composition in accordance with the subject invention, it is preferable that the (A) binder polymer contain (A2) resin having a (meth)acryloyl group in its molecule.

Further, in the photosensitive resin composition in accordance with the subject invention, it is preferable that the content of the (B) cross-linked polymer particles be more than 50 parts by weight but 500 parts by weight or less with respect to 100 parts by weight of the (A2) resin having a (meth)acryloyl group in its molecule.

Further, in the photosensitive resin composition in accordance with the subject invention, it is preferable that the (A) binder polymer contain (A3) resin which does not substantially have a (meth)acryloyl group in its molecule.

Further, in the photosensitive resin composition in accordance with the subject invention, it is preferable that the (B) cross-linked polymer particles be cross-linked polymer particles containing an urethane bond in its molecule.

Further, in the photosensitive resin composition in accordance with the subject invention, it is preferable that the (E) phosphoric flame retardant be phosphinate.

Further, in the photosensitive resin composition in accordance with the subject invention, it is preferable that content of the (E) phosphoric flame retardant be 5 parts by weight to 100 parts by weight with respect to 100 parts by weight of the (A) binder polymer.

Further, in the photosensitive resin composition in accordance with the subject invention, it is preferable that the content of the (B) cross-linked polymer particles be more than 50 parts by weight but 100 parts by weight or less with respect to 100 parts by weight of the (A) binder polymer.

A resin film in accordance with the subject invention is prepared by applying, onto a surface of a base material, a photosensitive resin composition of the present invention and drying the photosensitive resin composition.

An insulating film in accordance with the subject invention is prepared by curing the resin film.

A printed wiring board provided with an insulating film in accordance with the subject invention includes a printed wiring board; and the insulating film, covering the printed wiring board.

A photosensitive resin composition in accordance with the subject invention can be also arranged as follows.

In a photosensitive resin composition in accordance with the subject invention, it is preferable that the (A) binder polymer contain (A4) resin which does not substantially have a radical polymerizable group in its molecule and has a urethane bond and a carboxyl group in its molecule and (A5) resin which has a radical polymerizable group and a urethane bond in its molecule.

Further, it is preferable that the photosensitive resin composition in accordance with the subject invention include (F) organic solvent wherein the (E) phosphoric flame retardant is a flame retardant which is not substantially soluble in the organic solvent.

Further, the photosensitive resin composition in accordance with the subject invention preferably includes (G) coloring agent.

The resin film of the subject invention can be formed from the photosensitive resin composition of the subject invention.

The insulating film of the subject invention can be formed from the photosensitive resin composition of the subject invention.

The printed wiring board provided with an insulating film of the subject invention can include: a printed wiring board; and the insulating film, covering the printed wiring board.

Advantageous Effects of Invention

As described above, a photosensitive resin composition of the subject invention contains at least: (A) binder polymer; (B) cross-linked polymer particles; (C) thermosetting resin; (D) photo-polymerization initiator; and (E) phosphoric flame retardant, content of the (B) cross-linked polymer particle being 30 parts by weight to 100 parts by weight with respect to the 100 parts by weight of the (A) binder polymer, the (B) cross-linked polymer particles having an average particle diameter of 1 μm to 10 μm, so that the photosensitive resin composition of the present invention (i) obtains an excellent tack-free property after being applied and dried, (ii) can be subjected to fine processing so as to have photosensitivity, (iii) is formed into a cured film excellent in flexibility, flame retardancy, and electrical insulation reliability, and (iv) causes a substrate to have a small warpage after being cured. Accordingly, the photosensitive resin composition of the present invention can be used for protective films etc. of various circuit substrates, and yields an excellent effect.

BRIEF DESCRIPTION OF DRAWINGS

FIG. 1 is a schematic view of measurement of a warpage amount of a film.

DESCRIPTION OF EMBODIMENTS

[Embodiment A]
Hereinafter, the present invention will describe, in detail, (I) a photosensitive resin composition and (II) a method for using the photosensitive resin composition in this order.

(I) Photosensitive Resin Composition

A photosensitive resin composition of the present invention only needs to contain at least: (A) binder polymer; (B) cross-linked polymer particles; (C) thermosetting resin; (D) photo-polymerization initiator; and (E) phosphoric flame retardant, content of the (B) cross-linked polymer particle being 30 parts by weight to 100 parts by weight with respect to the 100 parts by weight of the (A) binder polymer, and the (B) cross-linked polymer particles having an average particle diameter of 1 μm to 10 μm.

The inventors of the present invention found that the photosensitive resin composition of the present invention had excellent various properties, and presume that reasons of this are as follows. Specifically, cross-linked polymer particles, which is a component (B), cause an applied film to have a rough surface, so that a resultant cured film has excellent tack-free property after the photosensitive resin composition is applied and dried, and, because the polymer particles are soft, the resultant cured film does not lose flexibility. Further, the (B) component is excellent in heat resistance and chemical resistance because the polymer particles have a cross-linking structure. Furthermore, the cured film, which is prepared by combining the (A) component with the (B) component, becomes remarkably soft to thereby obtain excellent folding endurance. The inventors of the present invention presume that a reason of the above is as follows: the (A) component forming a matrix of the cured film on the (B) component is soaked into the (B) component, so that the (A) component and the (B) component can obtain a high adhesiveness at an interface therebetween. Further, in the case where a filler component is highly filled, a resultant cured film obtains high elasticity and low elongation, which results in becoming a rigid, weak, and inflexible cured film. However, surprisingly, in the case where the (B) component (30 to 100 parts by weight) is highly filled to the (A) component (100 parts by weight), a resultant cured film has a reduced elasticity and improved elongation. Therefore, in the case where the cured film is used as an insulating protective film of a flexible print wiring board, a spring back after bending is suppressed, and the cured film obtains such high flexibility as to endure repeated bending.

The following description will discuss a method of mixing a (A) binder polymer, (A1) resin having a urethane bond in its molecule, (A2) resin having a (meth)acryloyl group in its molecule, (A3) resin which does not substantially have a (meth)acryloyl group in its molecule, (B) cross-linked polymer particles, (C) thermosetting resin, a (D) photo-polymerization initiator, a (E) phosphoric flame retardant, and another component(s), and a photosensitive resin composition.

<(A) Binder Polymer>

The (A) binder polymer of the present invention is a polymer which is soluble in an organic solvent and has a weight-average molecular weight of 1,000 or more but 1,000,000 or less based on polyethylene glycol. "(A) binder polymer" of the present invention is resin made from a single kind of resin or resin made from a plurality kinds of resin. "(A) binder polymer" herein is a general term for resin including a photosensitive resin composition.

While the above organic solvent is not particularly limited, examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, those organic polar solvents may be combined with aromatic hydrocarbon such as xylene or toluene as necessary.

Further, examples of the solvent encompass: solvents of symmetric glycol diethers such as methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis (2-ethoxyethyl)ether), and butyl diglyme (bis(2-butoxyethyl) ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy) ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether.

Organic solvent solubility, which is a barometer of solubility in an organic solvent, can be measured as parts by weight of a base polymer soluble in 100 parts by weight of an organic solvent. If the parts by weight of the base polymer soluble in the organic solvent (100 parts by weight) is 5 or more parts by weight, the base polymer is determined to be soluble in the organic solvent. A method of measuring the organic solvent solubility is not particularly limited. There can be employed, for example, such a method that: 5 parts by weight of a base polymer is added to 100 parts by weight of an organic solvent;

the mixture is agitated for one hour at 40° C.; the mixture is cooled to a room temperature and let stand for 24 or more hours; and a resultant solution is confirmed to become a homogeneous solution in which any insoluble matter or precipitate does not appear.

The weight-average molecular weight of the (A) component in accordance with the present invention can be measured by, for example, the following method.

(Measurement of weight-average molecular weight)
Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluting solvent: 30 mM LiBr+20 mM $H_3PO_4$ in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol).

It is preferable to adjust the weight-average molecular weight within the above range because a resultant cured film obtains excellent flexibility and excellent chemical resistance. If the weight-average molecular weight is 1,000 or less, the flexibility or the chemical resistance might decrease. Meanwhile, if the weight-average molecular weight is 1,000,000 or more, viscosity of the photosensitive resin composition might increase.

The (A) component of the present invention is not particularly limited. Examples of the polymer encompass polyurethane resin, poly(meth)acrylic-based resin, polyvinyl-based resin, polystyrene-based resin, polyethylene-based resin, polypropylene-based resin, polyimide-based resin, polyamide-based resin, polyacetal-based resin, polycarbonate-based resin, polyester-based resin, polyphenylene-ether-based resin, polyphenylene-sulfide-based resin, polyethersulfone-based resin, and polyetheretherketone-based resin. Those polymers can be used solely, or two or more thereof can be used in combination. It is particularly preferable that the (A) component contains polyurethane resin which is (A1) resin having a urethane bond in its molecule. This is because a cured film, which is obtained by curing the photosensitive resin composition, obtains improved flexibility and improved folding endurance, and warpage of the cured film is reduced. Further, it is preferable that the (A) component contains (A2) resin having a (meth) acryloyl group in its molecule. This is because the photosensitive resin composition obtains improved photosensitivity, and a cured film, which is obtained by curing the photosensitive resin composition, obtains improved chemical resistance. Further, it is preferable that the (A) component contains (A3) resin which does not substantially have a (meth) acryloyl group in its molecule. This is because a cured film, which is obtained by curing the photosensitive resin composition, obtains improved flexibility, folding endurance, and adhesiveness with a base material. Those resins described above may be used solely as the (A) component, or two or more thereof can be used in combination as the (A) component.

<(A1) Resin Having Urethane Bond in Molecule>

The resin having a urethane bond in its molecule, of the present invention, is a polymer which (i) has repeating units having at least one urethane bond in its molecule and (ii) has a weight-average molecular weight of 1,000 or more but 1,000,000 or less based on polyethylene glycol.

The (A1) resin having a urethane bond in its molecule of the present invention can be obtained by an arbitrary reaction. For example, the (A1) resin having a urethane bond in its molecule can be obtained, by reacting a diol compound which is represented by the following general formula (1):

[Chem. 1]

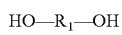  General formula (1)

(wherein $R_1$ represents a divalent organic group), with a diisocyanate compound which is represented by the following general formula (2):

[Chem. 2]

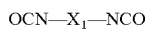  General formula (2)

(wherein $X_1$ represents a divalent organic group), as a structure having repeating units having a urethane bond which is represented by the following general formula (3):

[Chem. 3]

General formula (3)

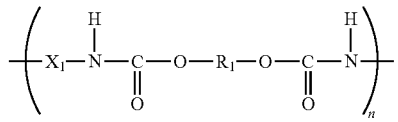

(wherein $R_1$ and $X_1$ independently represent a divalent organic group, and n represents an integer of 1 or more).

The diol compound is not particularly limited provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out a ring opening addition of lactones such as γ-butyl lactone, ε-caprolactone, and δ-valerolactone; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. Those compounds can be used solely, or two or more thereof can be used in combination.

It is particularly preferable to use a long chain diol, such as polyethylene glycol, polypropylene glycol, polytetra-methylene glycol, polyoxyalkylene diol, polyester diol, polycarbonate diol, or polycaprolactone diol. This is because a cured film, which is obtained by curing the photosensitive resin composition, is reduced in elasticity and is excellent in flexibility and small warpage.

The diisocyanate compound is not particularly limited, provided that it has the above structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. Those compounds can be used solely, or two or more thereof can be used in combination.

It is particularly preferable to use an alicyclic diisocyanate compound and an aliphatic diisocyanate compound because the photosensitive resin composition obtains excellent photosensitivity.

The resin having a urethane bond in its molecule in accordance with the present invention can be synthesized by, for example, mixing a diol compound and a diisocyanate compound so that a ratio of the number of hydroxyl groups to the number of isocyanate groups is isocyanate groups/hydroxyl groups=0.5 or more but 2.0 or less, and reacting the mixture without using a solvent or with use of an organic solvent.

In the case where two or more diol compounds are used, the two or more diol compounds may be reacted with the diisocyanate compound after the two or more diol compounds are mixed, or each of the two or more diol compounds may be independently reacted with the diisocyanate compound. Alternatively, the diol compound may be reacted with the diisocyanate compound in such a way that (i) a diol compound is initially reacted with the diisocyanate compound, (ii) a resultant terminal isocyanate compound is reacted with another diol compound, and (iii) a reactant is further reacted with the diisocyanate compound. In the case where two or more diisocyanate compounds are used, the reaction can be carried out in the same way as described above. In this way, a desired resin having a urethane bond in its molecule can be prepared.

The reaction between the diol compound(s) and the diisocyanate compound(s) is carried out at a temperature of, preferably, 40° C. to 160° C., and more preferably 60° C. to 150° C. If the temperature is less than 40° C., it takes too much time for the reaction. If the temperature exceeds 160° C., a three-dimensional reaction occurs during the reaction, which easily causes gelatinization. How long the reaction is carried out can be determined appropriately depending on a batch scale and a reaction condition to be employed. The reaction may be carried out in the presence of a catalyst such as tertiary amines or a metal or semi-metal compound (for example, alkaline metal, alkaline earth metal, tin, zinc, titanium, or cobalt) as necessary.

The above reaction can be carried out without any solvent. However, in order to control the reaction, it is preferable to carry out the reaction with use of an organic solvent. The organic solvent used herein is not particularly limited, and, for example, one of the above organic solvents can be used.

It is desirable that the organic solvent used in the reaction be added so that a solute concentration by weight in a reactant solution, i.e., a concentration of the reactant solution is 5% by weight or more but 90% by weight or less. The solute concentration by weight in the reactant solution is more desirably 10% by weight or more but 80% by weight or less. If the concentration of the reactant solution is 5% or less, it is difficult to cause a polymerization reaction and a reaction speed decreases. This may result in that a desired structural substance cannot be prepared. For this reason, the concentration of 5% by weight or less is not preferable.

It is preferable that the resin having a urethane bond in its molecule, of the present invention, further have at least one organic group selected from the group consisting of the following (a1)-(a3): (a1) a (meth)acryloyl group; (a2) a carboxyl group; and (a3) an imide group. The (a1) (meth)acryloyl group means an acryloyl group and/or a methacryloyl group. In the case where the resin contains the (a1) (meth)acryloyl group, a photosensitive resin composition obtains improved photosensitivity. This makes it possible to cure the photosensitive resin composition through radiation with ultraviolet rays for a short time. In the case where the resin contains the (a2) carboxyl group, a photosensitive resin composition obtains an improved solubility in a dilute alkaline aqueous solution serving as a developing solution. This makes it possible to form a fine pattern with a short-time development. In the case where the resin contains the (a3) imide group, a photosensitive resin composition is improved in heat resistance and electrical insulation reliability under the condition of a high temperature and high humidity. It is therefore possible to obtain a highly-reliable printed wiring board by using the photosensitive resin composition as a covering material for a printed wiring board.

The resin having a urethane bond in its molecule, which has the (a1) (meth)acryloyl group, can be obtained by an arbitrary reaction. For example, it is possible to obtain the resin by reacting the diol compound, the diisocyanate compound, a compound which has a hydroxyl group and at least one (meth)acryloyl group and is represented by the following general formula (4):

[Chem. 4]

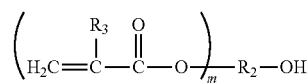

General formula (4)

(wherein $R_2$ represents a (m+1) valent organic group, $R_3$ represents hydrogen or an alkyl group, and m represents an integer of 1 to 3),
and/or a compound which has an isocyanate group and at least one (meth)acryloyl group and is represented by the following general formula (5):

[Chem. 5]

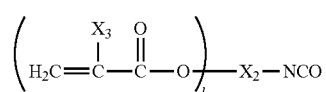

General formula (5)

(wherein $X_2$ represents a (1+1) valent organic group, $X_3$ represents hydrogen or an alkyl group, and l represents an integer of 1 to 3).

The compound containing a hydroxyl group and at least one (meth)acryloyl group is not particularly limited, provided that it has the above structure. Examples of the compound encompass 2-hydroxyethyl (meth)acrylate, 2-hydroxypropyl (meth)acrylate, 2-hydroxybutyl(meth)acrylate, 2-hydroxy-3- phenoxypropyl(meth)acrylate, 2-hydroxy-1-acryloxy-3-methacryloxy propan, o-phenylphenolglycidyl ether(meth)acrylate, polyethylene glycol mono(meth)acrylate, pentaerythritol tri(meth)acrylate, tris(2-hydroxyethyl)isocyanurate di(meth)acrylate, 1,4-cyclohexanedimethanol mono(meth)acrylate, 4-hydroxyphenyl (meth)acrylate, 2-(4-hydroxyphenyl)ethyl (meth)acrylate, and N-methylolacrylamide, 3,5-dimethyl-4-hydroxybenzyl acrylamide. Those compounds can be used solely, or two or more thereof can be used in combination.

The compound containing an isocyanate group and at least one (meth)acryloyl group is not particularly limited, provided that it has the above structure. Examples of the compound encompass 2-(meth)acryloyloxyethyl isocyanate, 1,1-bis(acryloyloxymethyl)ethyl isocyanate, and 2-(2-methacryloyloxyethyloxy)ethyl isocyanate. Those compounds can be used solely, or two or more thereof can be used in combination.

The resin having a urethane bond in its molecule, which has the (a2) carboxyl group, can be obtained by an arbitrary reaction. For example, it is possible to obtain the resin by reacting the diol compound, the diisocyanate compound, and a compound which has two hydroxyl groups and one carboxyl group and is represented by the following general formula (6):

[Chem. 6]

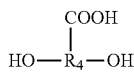

General formula (6)

(wherein $R_4$ represents a trivalent organic group).

The compound having two hydroxyl groups and one carboxyl group is not particularly limited provided that it has the above structure. Examples of the compound encompass 2,2-bis(hydroxymethyl)propionic acid, 2,2-bis(2-hydroxyethyl)propionic acid, 2,2-bis(3-hydroxymepropyl)propionic acid, 2,3-dihydroxy-2-methylpropionic acid, 2,2-bis(hydroxymethyl)butanoic acid, 2,2-bis(2-hydroxyethyl)butanoic acid, 2,2-bis(3-hydroxypropyl)butanoic acid, 2,3-dihydroxybutanoic acid, 2,4-dihydroxy-3,3-dimethylbutanoic acid, 2,3-dihydroxy hexadecanoic acid, 2,3-dihydroxy benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid. Those compounds can be used solely, or two or more thereof can be used in combination.

It is particularly preferable to use a photosensitive resin composition containing an aliphatic-based compound having two hydroxyl groups and one carboxyl group because the photosensitive resin composition has excellent photosensitivity.

The resin having a urethane bond in its molecule, which has the (a3) imide group, can be obtained by an arbitrary reaction. For example, it is possible to obtain the resin by reacting the diol compound, the diisocyanate compound, tetracarboxylic acid dianhydride represented by the following general formula (7):

[Chem. 7]

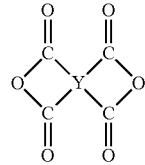

General formula (7)

(wherein Y represents a quadrivalent organic group).

Tetracarboxylic acid dianhydride is not particularly limited provided that it has the above structure. Examples of the tetracarboxylic acid dianhydride encompass 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride. Those kinds of tetracarboxylic acid dianhydrides can be used alone, or two or more kinds thereof can be used in combination.

<(A2) Resin Having (Meth)Acryloyl Group in Molecule>

The (A2) resin having a (meth)acryloyl group in its molecule, of the present invention, is a polymer which (i) has at least one (meth)acryloyl group in its molecule and (ii) has a weight-average molecular weight of 1,000 or more but 1,000,000 or less based on polyethylene glycol. The (meth)acryloyl group means a methacryloyl group and/or an acryloyl group.

The (A2) resin having a (meth)acryloyl group in its molecule, of the present invention, can be obtained by an arbitrary reaction. For example, it is possible to obtain the (A2) resin by a method similar to the method of obtaining the (A1) resin having a urethane bond in its molecule, which has the (a1) (meth)acryloyl group.

In addition to the above method, the (A2) resin can be obtained by reacting epoxy resin with a (meth)acrylic acid.

Epoxy resin of the present invention is not particularly limited. Examples of bisphenol A epoxy resin encompass: jER828, jER1001, and jER1002 (trade name) manufactured by Japan Epoxy Resins Co., Ltd.; ADEKA RESIN EP-4100E and ADEKA RESIN EP-4300E (trade name) manufactured by ADEKA CORPORATION; RE-310S and RE-410S (trade name) manufactured by Nippon Kayaku Co., Ltd.; EPICLON 840S, EPICLON 850S, EPICLON 1050, and EPICLON 7050 (trade name) manufactured by DIC Corporation; and Epotote YD-115, Epotote YD-127, and Epotote YD-128 (trade name) manufactured by Tohto Kasei Co., Ltd. Examples of bisphenol F epoxy resin encompass: jER806 and jER807 (trade name) manufactured by Japan Epoxy Resins Co., Ltd.; ADEKA RESIN EP-4901E and ADEKA RESIN EP-4930, and ADEKA RESIN EP-4950 (trade name) manufactured by ADEKA CORPORATION; RE-303S, RE-304S, RE-403S, and RE-404S, (trade name) manufactured by Nippon Kayaku Co., Ltd.; and EPICLON 830 and EPICLON 835 (trade name) manufactured by DIC Corporation; Epotote YDF-170, Epotote YDF-175S, and Epotote YDF-2001 (trade name) manufactured by Tohto Kasei Co., Ltd. Examples of bisphenol S epoxy resin encompass: EPICLON EXA-1514 (trade name) manufactured by DIC Corporation. Examples of hydrogenated bisphenol A epoxy resin encompass:

jERYX8000, jERYX8034, and jERYL7170 (trade name) manufactured by Japan Epoxy Resins Co., Ltd.; ADEKA RESIN EP-4080E (trade name) manufactured by ADEKA CORPORATION; EPICLON EXA-7015 (trade name) manufactured by DIC Corporation; Epotote YD-3000, and Epotote YD-4000D (trade name) manufactured by Tohto Kasei Co., Ltd. Examples of biphenyl epoxy resin encompass: jERYX4000, jERYL6121H, jERYL6640, and jERYL6677 (trade name) manufactured by Japan Epoxy Resins Co., Ltd.; and NC-3000 and NC-3000H (trade name) manufactured by Nippon Kayaku Co., Ltd. Examples of phenoxy epoxy resin encompass: jER1256, jER4250, and jER4275 (trade name) manufactured by Japan Epoxy Resins Co., Ltd. Examples of naphthalene epoxy resin encompass EPICLON HP-4032, EPICLON HP-4700, and EPICLON HP-4200 (trade name) manufactured by DIC Corporation; and NC-7000L (trade name) manufactured by Nippon Kayaku Co., Ltd. Examples of phenol novolac epoxy resin encompass: jER152 and jER154 (trade name) manufactured by Japan Epoxy Resins Co., Ltd.; EPPN-201-L (trade name) manufactured by Nippon Kayaku Co., Ltd.; EPICLON N-740 and EPICLON N-770 (trade name) manufactured by DIC Corporation; Epotote YDPN-638 (trade name) manufactured by Tohto Kasei Co., Ltd. Examples of cresol novolac epoxy resin encompass EOCN-1020, EOCN-102S, EOCN-103S, and EOCN-104S (trade name) manufactured by Nippon Kayaku Co., Ltd.; and EPICLON N-660, EPICLON N-670, EPICLON N-680, and EPICLON N-695 (trade name) manufactured by DIC Corporation. Examples of trisphenol methan epoxy resin encompass EPPN-501H, EPPN-501HY, and EPPN-502H (trade name) manufactured by Nippon Kayaku Co., Ltd. Examples of dicyclopentadiene epoxy resin encompass: XD-1000 (trade name) manufactured by Nippon Kayaku Co., Ltd.; and EPICLON HP-7200 (trade name) manufactured by DIC Corporation. Examples of amine epoxy resin encompass: jER604 and jER630 (trade name) manufactured by Japan Epoxy Resins Co., Ltd.; Epotote YH-434 and Epotote YH-434L (trade name) manufactured by Tohto Kasei Co., Ltd.; and TETRAD-X, TERRAD-C (trade name) manufactured by MITSUBISHI GAS CHEMICAL COMPANY, INC. Examples of flexible epoxy resin encompass: jER871, jER872, jERYL7175, and jERYL7217 (trade name) manufactured by Japan Epoxy Resins Co., Ltd.; and EPICLON EXA-4850 (trade name) manufactured by DIC Corporation. Examples of urethane modified epoxy resin encompass ADEKA RESIN EPU-6, ADEKA RESIN EPU-73, and ADEKA RESIN EPU-78-11 (trade name) manufactured by ADEKA CORPORATION. Examples of rubber modified epoxy resin encompass ADEKA RESIN EPR-4023, ADEKA RESIN EPR-4026, and ADEKA RESIN EPR-1309 (trade name) manufactured by ADEKA CORPORATION. Examples of chelate modified epoxy resin encompass ADEKA RESIN EP-49-10 and ADEKA RESIN EP-49-20 (trade name) manufactured by ADEKA CORPORATION. Examples of heterocycle-containing epoxy resin encompass TEPIC (trade name) manufactured by Nissan Chemical Industries, Ltd. Those resins can be used solely, or two or more thereof can be used in combination.

A reaction between epoxy resin and a (meth)acrylic acid can be carried out by an arbitrary method. For example, an epoxy(meth)acrylate resin solution can be prepared in such a way that: a (meth)acrylic acid and an esterification catalyst (tertiary amine such as trimethylamine, triethylamine, triphenylphosphine which is a phosphorus compound, or 2-ethyl-4-methyl imidazole which is an imidazole compound is preferably used) is added to a solution that is prepared in advance by dispersing or dissolving epoxy resin into an organic solvent; and the solution is heated to 40° C. or more but 120° C. or less so that the epoxy resin and the (meth)acrylic acid are reacted with each other. In this case, the (meth)acrylic acid is added so that a total added amount of the (meth)acrylic acid is 0.1 mol to 1.0 mol with respect to 1 mol of an epoxy group of the epoxy resin.

<(A3) Resin which does not Substantially have (meth) acryloyl Group in Molecule>

What is meant by "the resin which does not substantially have a (meth)acryloyl group in its molecule" in accordance with the present invention is a polymer which (i) does not substantially have a (meth)acryloyl group in its molecule and (ii) has a weight-average molecular weight of 1,000 or more but 1,000,000 or less based on polyethylene glycol. Here, what is meant by "does not substantially have a (meth)acryloyl group in its molecule" is that the resin has no (meth) acryloyl group in its molecule or has one or few (meth) acryloyl groups in its molecule provided that it does not prevent the effect of the present invention. The range in which the effect of the present invention is not prevented means that a value quantitated by measuring a (meth)acryloyl group in a molecule as an iodine value is less than 5. The iodine value indicates an amount of halogen which is bonded with a test sample (100 g) when the test sample is reacted with halogen, and is expressed in terms of grams of iodine converted from the amount of halogen. The iodine value can be measured by a method defined in the JIS K0070.

The (A3) resin which does not substantially have a (meth) acryloyl group in its molecule in accordance with the present invention can be carried out by an arbitrary reaction. For example, the resin can be obtained by reacting a (meth)acrylic acid and/or a (meth)acrylic acid ester derivative in a solvent in the presence of a radical polymerization initiator.

The (meth)acrylic acid ester derivative of the present invention is not particularly limited. Examples of the (meth) acrylic acid ester derivative encompass: methyl (meth)acrylate, ethyl (meth)acrylate, butyl (meth)acrylate, isobutyl (meth)acrylate, tertiary butyl (meth)acrylate, hexyl (meth) acrylate, 2-ethylhexyl (meth)acrylate, octyl (meth)acrylate, nonyl (meth)acrylate, decyl (meth)acrylate, dodecyl (meth) acrylate, stearyl (meth)acrylate, and benzyl (meth)acrylate. Those (meth)acrylic acid ester derivatives can be used solely, or two or more thereof can be used in combination. Among those (meth)acrylic acid ester derivatives, it is particularly preferable to use a photosensitive resin composition containing methyl (meth)acrylate, ethyl (meth)acrylate, or butyl (meth)acrylate in terms of flexibility and chemical resistance of a cured film made from the photosensitive resin composition.

Examples of the radical polymerization initiator encompass: azo-based compounds such as azobisisobutyronitrile, azobis(2-methylbutyronitrile), and 2,2'-azobis-2,4-dimethylvaleronitril; organic peroxides such as t-butyl hydroperoxide, cumene hydroperoxide, benzoyl peroxide, dicumyl peroxide, and di-t-butyl perodxide; and persulfates such as potassium persulfate, sodium persulfate, and ammonium peroxodisulfate; and hydrogen peroxide. Those radical polymerization initiators can be used solely, or two or more thereof can be used in combination.

A usage amount of the radical polymerization initiator is preferably 0.001 part by weight to 5 parts by weight with respect to 100 parts by weight of monomer to be used, and more preferably 0.01 part by weight to 1 part by weight. If the usage amount of the radical polymerization initiator is less than 0.001 part by weight, the reaction does not smoothly progress. Meanwhile, if the usage amount of the radical polymerization initiator is more than 5 parts by weight, a molecular weight thereof is reduced in some cases.

It is preferable that an amount of the solvent for use in the above reaction be determined so that a solute concentration by weight in a reacted solution, i.e., a concentration of the reacted solution is 5% by weight or more but 90% by weight or less, and more preferably 20% by weight or more but 70% by weight or less. If the concentration of the reacted solution is less than 5%, a polymerization reaction would be difficult to take place, and a reaction rate might become slow, and in addition, a desired structured-material might not be prepared. Further, if the concentration of the solution is more than 90% by weight, the reacted solution becomes highly viscous in some cases, which results in an ununiformal reaction.

A reaction temperature of the reaction is preferably set to 20° C. to 120° C., and more preferably 50° C. to 100° C. If the temperature is less than 20° C., a reaction time becomes too long. Meanwhile, if the temperature exceeds 120° C., the reaction may be too rapidly progressed or gelling may be caused by three-dimensional cross-linking in accordance with a side reaction. The reaction time can be appropriately selected in accordance with a magnitude of a batch and/or an employed reaction condition.

<(B) Cross-Linked Polymer Particles>

The "(B) cross-linked polymer particles" of the present invention is a round polymer which has a cross-linking structure in its molecule and whose average particle diameter is 1 µm to 100 µm. The term "round" encompass a true spherical shape and an oval shape. If the average particle diameter is 1 µm or less, the viscosity and thixotropy of the photosensitive resin composition becomes high. This may, in some cases, cause foaming of a material of an applied film at the time of applying the film or poor appearance due to shortage of leveling. Further, the cross-linked polymer particles do not form a surface rough enough, so that the photosensitive resin composition, which is applied and dried, may become sticky and have a poor tack-free property. Meanwhile, if the average particle diameter is 100 µm or more, a particle might be exposed at an opening when a fine pattern is formed, and therefore resolution might be decreased.

An average particle diameter of the (B) component of the present invention is preferably 1 µm to 50 µm, and more preferably 1 µm to 10 µm because the resolution of the fine pattern is improved, and a resultant cured film obtains excellent flexibility and excellent chemical resistance.

The average particle diameter of the (B) component of the present invention can be measured, as a median size based on volume (which is a particle diameter with respect to 50% of a value of cumulative size distribution), by the following method, for example.

(Measurement of Average Particle Diameter)
Device: Counterpart of LA-950V2 Manufactured by HORIBA, Ltd.
Measurement Method: Laser Diffraction/Scattering In the present invention, it is necessary that a content of the (B) cross-linked polymer particle is 30 parts by weight to 100 parts by weight with respect to 100 parts by weight of the (A) binder polymer, and preferably the content is more than 50 parts by weight but 100 parts by weight or less.

Conventionally, in the case where a filler component is highly filled, the elasticity is increased and elongation is decreased, so that a resultant cured film becomes rigid and weak, which results in reduction in flexibility. In the present invention, however, the cured film does not lose the flexibility because polymer particles are soft. Further, the polymer particles becomes excellent in heat resistance and chemical resistance because the polymer particles have a cross-linking structure. Further, in the case where the (A) component and the (B) component are combined with each other, the (A) component forming a matrix of the cured film is soaked into the (B) component. This makes it possible that the (A) component and the (B) component obtain high adhesiveness at an interface therebetween. Therefore, a resultant applied film becomes remarkably soft to thereby obtain excellent folding endurance. This makes it possible to effectively cause a resultant cured film to have a rough surface. Therefore, the resultant cured film obtains an excellent tack-free property. In addition, the resultant cured film has a small warpage because of a filling effect by the (B) component, the elasticity of the cured film is decreased, and the elongation of the cured film is improved. Therefore, in the case where the cured film is used as an insulating protective film of a flexible print wiring board, a spring back after bending is suppressed, and the cured film obtains such a good flexibility as to endure repeated bending. If the (B) component is less than 30 parts by weight, the tack-free property and/or the flexibility to endure repeated bending is/are deteriorated, meanwhile, if the (B) component is more than 100 parts by weight, the flame retardancy and a coating property at the time of applying a solution of the photosensitive resin composition may be deteriorated. This causes foaming of an applied film at the time of applying the film, or poor appearance due to shortage of leveling.

It is preferable that a content of the (B) component be more than 50 parts by weight but 500 parts by weight or less with respect to 100 parts by weight of the (A2) resin having a (meth)acryloyl group in its molecule. This is because curing shrinkage occurring when the (meth)acryloyl group which is a photosensitive group is reacted is suppressed by an internal stress reduction effect, which results in reducing warpage of the cured film.

While the (B) component of the present invention is not particularly limited, examples of the (B) component encompass: polymethyl methacrylate cross-linked polymer particles such as GANZ PEARL (product name) GM-0600 and GM-0600W, manufactured by Ganz Chemical Co., Ltd.; cross-linked polymethyl methacrylate cross-linked polymer particles such as GANZ PEARL (product name) GM-0105, GM-0205S, GM-0401S, GM-0407S, GM-0449S, GM-0630H, GM-0801S, GM-0807S, GM-0849SGM-1001, GM-1001-S, GM-1007S, GM-1407S, GM-1505S-S, GM-2001, GM-2003S-S, GM-2007S, GM-2801, GM-4003, GM-5003, GM-9005, GMX-0610, GMX-0810, GMP-0800, GMDM-050M, GMDM-080M, GMDM-100M, and GMDM-150M, manufactured by Ganz Chemical Co., Ltd., and Techpolymer (product name) MBX-5, MBX-8, and MBX-12, manufactured by Sekisui Plastics Co., Ltd.; cross-linked polybuthyl methacrylate cross-linked polymer particles such as GANZ PEARL (product name) GB-05S, GB-08S, GB-10S, and GB-15S, manufactured by Ganz Chemical Co., Ltd., and Techpolymer (product name) BM30X-5 and BM30X-8, manufactured by Sekisui Plastics Co., Ltd.; cross-linked acrylic cross-linked polymer particles such as GANZ PEARL (product name) GMP-0820, manufactured by Ganz Chemical Co., Ltd.; acryl copolymer cross-linked polymer particles such as GANZ PEARL (product name) GBM-55COS, manufactured by Ganz Chemical Co., Ltd.; cross-linked styrene cross-linked polymer particles such as GANZ PEARL (product name) GS-0605 and GS-1105, manufactured by Ganz Chemical Co., Ltd., and Techpolymer (product name) SBX-6 and SBX-8, manufactured by Sekisui Plastics Co., Ltd.; cross-linked polyacrylic ester cross-linked polymer particles such as Techpolymer (product name) ABX-8, AF10X-8, AFX-15, and ARX-15, manufactured by Sekisui Plastics Co., Ltd.; nylon cross-linked polymer particles such as GANZ PEARL GPA-550 (product name), manufactured by Ganz Chemical Co., Ltd.; silicone cross-linked polymer particles such as GANZ PEARL (product name) such as SI-020, SI-030, and SI-045, manufactured by Ganz Chemical Co., Ltd.; cross-linked silicone cross-linked polymer particles such as GANZ PEARL (product name) SIG-070, manufactured by Ganz Chemical Co., Ltd.; cross-linked urethane cross-linked polymer particles such as DAIMIC BEAZ (trade name) UCN-8070CM clear, UCN-8150CM clear, UCN-5070D clear, and UCN-5150D clear, manufactured by Dainichiseika Color & Chemicals Mfg. Co., Ltd., and Art Pearl (trade name) C-100 clear, C-200 clear, C-300 clear, C-300WA, C-400 clear, C-400WA, C-600 clear, C-800 clear, C-800WA, P-400T, P-800T, U-600T, CF-600T, JB-400T, JB-800T, CE-400T, and CE-800T, manufactured by Negami chemical industrial co., ltd. Those components can be used solely, or two or more thereof can be used in combination.

Among the above cross-linked polymer particles, the (B) component of the present invention particularly preferably employs cross-linked polymer particles having an urethane bond in its molecule in order to reduce warpage of a resultant cured film and to improve the flexibility to endure repeated bending.

<(C) Thermosetting Resin>

The "(C) thermosetting resin" of the present invention is a compound having at least one thermosetting organic group in its molecule.

The component (C) of the present invention is not particularly limited, provided that it has the above structure. Examples of the component (C) encompass: epoxy resin; oxetane resin; phenol resin; isocyanate resin; block isocyanate resin; bismaleimide resin; bisallylnadiimide resin; polyester resin (e.g., unsaturated polyester resin); diallylphthalate resin; silicon resin; venylester resin; melamine resin; polybismaleimide triazine resin (BT resin); cyanate resin (e.g., cyanate ester resin); urea resin; guanamine resin; sulfonamide resin; aniline resin; polyurea resin; thiourethane resin; polyazomethine resin; episulphide resin; enethiol resin; benzoxazine resin; copolymer resins thereof; modified resins thereof, which are prepared by modifying those resins; mixtures of those resins; and mixtures of one or more of those resins with (an)other resin(s).

Among the above thermosetting resins, it is particularly preferable to use polyfunctional epoxy resin as the component (C) of the present invention. This is because a resultant cured film, which is prepared by curing a photosensitive resin composition, obtains not only a heat resistance, but also an adhesiveness with a conductor (such as metallic foil) or a circuit substrate.

The polyfunctional epoxy resin is a compound having at least two epoxy groups in its molecule, and is not particularly limited. For example, the above examples cited as the epoxy resin can be used as the polyfunctional epoxy resin.

A curing agent of the thermosetting resin which is contained in a photosensitive resin composition of the present invention is not particularly limited. Examples of the curing agent encompass: phenol resins such as phenol novolac resin, cresol novolac resin, and naphthalene phenol resin; amino resin; urea resin; melamine; and dicyandiamide. Those curing agents can be used solely, or two or more thereof can be used in combination.

A curing accelerator is not particularly limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]ethyl-s-triazine, and 2,4-diamino-6-[2'-ethyl-4'-methylimidazolyl-(1')]-ethyl-s-triazine. Those curing accelerators can be used solely, or two or more thereof can be used in combination.

<(D) Photo-Polymerization Initiator>

The (D) photopolymerization initiator of the present invention is a compound that is activated by energy of UV or the like, and initiates and promotes a reaction of a radical polymerizable group.

The (D) photopolymerization initiator of the present invention is not particularly limited provided that it has the above structure. Examples of the (D) photopolymerization initiator encompass Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9, 10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis (trichloromethyl)-S-triazine, 2[2'(5"-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-on, 1-hydroxycyclohexyl-phenyl-ketone, 2-hydroxy-2-methyl-1-phenyl-propane-1-on, 1-[4-(2-hydroxyethoxy)-phenyl]-2-hydroxy-2-methyl-1-propane-1-on, 2-methyl-1-[4-(methylthio) phenyl]-2-morpholinopropane-1-on, 2-benzyl-2-dimethylamino-1-(4-morpholinophenyl)-butane-1, bis(2,4, 6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanedione, 1-[4-(phenylthio)-,2-(O-benzoyloxime)], iodonium, (4-methylphenyl)[4-(2-methylpropyl)phenyl]-hexafluorophosph ate(1-), ethyl-4-dimethylaminobenzoate, 2-ethylhexyl-4-dimethylaminobenzoate, ethanone, and 1-[9-ethyl-6-(2-methylbenzoyl)-9H-carbazol-3-yl]-1-(O-acetyloxime).

Those photopolymerization initiators can be used solely, or two or more thereof can be used in combination.

<(E) Phosphorous Flame Retardant>

The (E) phosphorous flame retardant of the present invention is a compound that contains at least one elemental phosphorus in its molecule and has an effect of suppressing burning of organic matter. Note that a form of the (E) phosphoric flame retardant of the present invention is not particularly limited, and may be a filler-type flame retardant.

The (E) component of the present invention is not particularly limited provided that it has the above structure. Examples of the (E) component encompass red phosphorus, a condensed phosphoric ester compound, a cyclic organic phosphorus compound, a phosphazene compound, a phosphorus-containing (meth)acrylate compound, a phosphorus-containing epoxy compound, a phosphorus-containing polyol compound, a phosphorus-containing amine compound, polyphosphate ammonium, melamine phosphate, and phosphinate. Those components can be used solely, or two or more thereof can be used in combination.

It is particularly preferable to use, as the (E) component of the present invention, phosphinate among the above phosphorous flame retardants. This is because a resultant cured film, prepared by curing a photosensitive resin composition, can obtain excellent flame retardancy and reduce bleeding out of a flame retardant from the cured film to thereby suppress a contact fault and contamination during processes.

Phosphinate of the present invention is a compound represented by the following general formula (8).

[Chem. 8]

General formula (8)

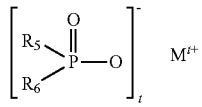

(wherein $R_5$ and $R_6$ independently represent a linear or branched $C_1$-$C_6$ alkyl or aryl group, M represents at least one metal selected from the group consisting of Mg, Ca, Al, Sb, Sn, Ge, Ti, Fe, Zr, Zn, Ce, Bi, Sr, Mn, Li, Na, and K, and t is an integer of 1 to 4.).

Phosphinate of the present invention is not particularly limited provided that it has the above structure. Examples of the phosphinate encompass aluminum tris(diethyl phosphinate), aluminum tris(methylethyl phosphinate), aluminum tris(diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), and titanyl bis(diphenyl phosphinate). These phosphinates can be used solely, or two or more thereof can be used in combination. Particularly, aluminum tris(diethylphosphinate) and aluminum tris(methylethyl phosphinate) are preferable because use of them makes it possible to obtain a high flame retardancy.

A content of the (E) component of the present invention is preferably 5 to 100 parts by weight, more preferably 10 to 50 parts by weight relative to 100 parts by weight of the (A) component. Therefore, the resultant cured film is excellent in flame retardancy and electrical insulation reliability. If the content of the (E) component is less than 5 parts by weight, the cured film may have poor flame retardancy. If the content of the (E) component is more than 100 parts by weight, the folding endurance may be deteriorated, or a coating property at the time of applying a photosensitive resin composition solution may be deteriorated, which results in causing, in some cases, foaming of a material of an applied film at the time of applying the film, or poor appearance due to shortage of leveling.

<Other Components>

The photosensitive resin composition of the present invention can further contain, as necessary, various additives such as a radical polymerizable compound, a filler, an adhesion promoting agent, a defoaming agent, a leveling agent, a coloring agent, and a polymerization inhibitor.

The radical polymerizable compound is a compound having, in its molecule, radical polymerizable group which has been polymerized by a radical polymerization initiator. Particularly, a radical polymerizable compound having at least one unsaturated double bond in its molecule is preferable. Further, the unsaturated double bond is preferably a (meth)acryloyl group or a vinyl group.

It is preferable that the radical polymerizable compound be used in the case where the (A) component does not have a (meth)acryloyl group. Further, the radical polymerizable compound may be used even in the case where the (A) component has a (meth)acryloyl group.

Examples of the radical polymerizable compound encompass: bisphenol F EO-modified (n=2 to 50) diacrylate, bisphenol A EO-modified (n=2 to 50) diacrylate, bisphenol S EO-modified (n=2 to 50) diacrylate, bisphenol F EO-modified (n=2 to 50) dimethacrylate, bisphenol A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s- triazine, triallyl 1,3-5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. Those compounds can be used solely, or two or more thereof can be used in combination. It is particularly preferable to use diacrylate or dimethacrylate having 2 to 50 mol of repeating units of EO (ethylene oxide) in its molecule. This is because a solubility of the photosensitive resin composition in an aqueous developing solution, which is typically represented by an alkaline aqueous solution, is improved, and the developing time is reduced.

Examples of the filler encompass fine inorganic fillers such as silica, mica, talc, barium sulfate, wollastonite, and calcium carbonate.

Examples of the defoaming agent encompass acryl-based compounds, vinyl-based compounds, and butadiene-based compounds.

The leveling agent to be contained may be, for example, an acryl-based compound or a vinyl-based compound.

The coloring agent to be contained may be a phthalocyanine-based compound, an azo-based compound, carbon black, or the like.

The adhesion promoting agent (also called an adhesion promoter) to be contained may be a silane coupling agent, a triazole-based compound, a tetrazole-based compound, a triazine-based compound, or the like.

The polymerization inhibitor to be contained may be hydroquinone, hydroquinone monomethylether, or the like.

The photosensitive resin composition of the present invention has the excellent flame retardancy because the photosensitive resin composition has the (E) compound, but may contain another flame retardant to obtain a higher flame retardant effect. The flame retardant to be contained may be, a halogen-based compound, a metal hydroxide, or a melamine-based compound. Those various additives can be used solely, or two or more thereof can be used in combination.

<Method of Mixing Photosensitive Resin Composition>

It is possible to prepare the photosensitive resin composition of the present invention by grinding•dispersing the components (A) through (E) and (an)other component(s) and then mixing them. A method of grinding•dispersing those components is not particularly limited, and is carried out with use of, for example, a general mixing device such as a beads-mill, a ball mill, or a triple-roll mill. It is possible to measure a particle diameter of particles contained in the photosensitive resin composition by a method with use of a gauge which is defined by JIS K 5600-2-5. It is also possible to measure an average particle diameter, particle diameters, and a particle size distribution in a case of using a particle size distribution measurement device.

(II) Method of Using Photosensitive Resin Composition

The photosensitive resin composition of the present invention can be directly formed into a cured film or a relief pattern, or can be formed into a cured film or a relief pattern after the photosensitive resin composition solution is prepared as follows. Initially, the photosensitive resin composition is applied to a substrate, Alternatively, the photosensitive resin composition solution is applied to a substrate, and is dried so as to remove an organic solvent. The application of the photosensitive resin composition or the photosensitive resin composition solution to the substrate may be carried out by screen printing, curtain rolling, reverse rolling, spray coating, rotational application by use of a spinner, or the like. An applied film (having a thickness of preferably 5 μm to 100 μm, particularly preferably 10 μm to 100 μm) is dried at 120° C. or less, preferably at 40° C. to 100° C.

After the applied film is dried, a negative photomask is placed on the applied film thus dried, and is irradiated with active light such as ultraviolet rays, visible light, or electron beams. Then, a portion, in the applied film, which is not exposed to light is washed with a developing solution by a method such as a shower method, a paddle method, a soaking method, an ultrasonic method, or the like method so as to form a relief pattern. Since a time required for the pattern to be exposed differs depending on (i) a spray pressure and a flow speed of the developing device and (ii) a temperature of the etching solution, it is preferable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds for use in preparation of the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Further, any other compounds are obviously usable as long as the aqueous solution exhibits basicity. The alkaline compound that is used in the step of developing the photosensitive resin composition of the present invention has a concentration of preferably 0.01% to 20% by weight, particularly preferably 0.02% to 10% by weight. A temperature of the alkaline developing solution depends on a composition of the photosensitive resin composition and a composition of the developing solution. Generally, the temperature of the developing solution is preferably 0° C. or more but 80° C. or less, more preferably 10° C. or more but 60° C. or less.

The relief pattern thus formed in the developing step is rinsed to remove unnecessary residues of the developing solution. Examples of a rinsing fluid for use in the rinse encompass water and an acidic aqueous solution.

Next, the relief pattern thus obtained is subjected to a heat treatment. By carrying out the heat treatment, and then reacting residual reactive groups with each other in a molecular structure, it is possible to prepare a cured film having excellent heat resistance. A thickness of the cured film is determined in consideration of a thickness of wiring lines and the like, but is preferably about 2 μm to 50 μm. As for a final curing temperature in the heat treatment, it is desirable that the film be cured by heating at low temperatures so as to prevent oxidization of the wiring lines and the like and a decrease in adhesiveness of the wiring lines to a base material.

The curing temperature at this time is preferably 100° C. or more but 250° C. or less, further preferably 120° C. or more but 200° C. or less, particularly preferably 130° C. or more but 180° C. or less. It is not preferable that a final heat temperature be high because deterioration of the wiring lines due to oxidation is promoted.

A cured film formed from the photosensitive resin composition of the present invention is excellent in flexibility, flame retardancy, and electrical insulation reliability, and a substrate after curing has a small warpage.

Further, an insulating film obtainable from the photosensitive resin composition has a thickness of, preferably, about 2 μm to 50 μm. The insulating film after photo-curing has a resolution of at least up to 10 μm, and in particular, a resolution of about 10 μm to 1000 μm. In view of this, the insulating film obtainable from the photosensitive resin composition is particularly suitable as an insulating material for a flexible substrate. Furthermore, the insulating film is usable to various of photo-curable wiring coating protective agents, photosensitive heat-resistant adhesives, insulating coatings of an electric wire and cable, and the like.

In the present invention, it is also possible to provide a similar insulating material with use of a resin film obtainable by applying, onto a surface of a base material, the photosensitive resin composition or the photosensitive resin composition solution, and drying the solution thus applied.

[Embodiment B]

A photosensitive resin composition of the present invention can be also configured as below.

In the photosensitive resin composition of Embodiment B, a (A) binder polymer can contain (A4) resin which does not substantially have a radical polymerizable group in its molecule and has a urethane bond and a carboxyl group in its molecule and (A5) resin which has a radical polymerizable group and a urethane bond in its molecule.

The inventors of the present invention found that the photosensitive resin composition of Embodiment B had excellent various properties, and presume that reasons of this are specifically as follows: specifically, a cured film, which is formed from a photosensitive resin composition containing resin, which is a (A4) component which does not substantially have a radical polymerizable group in its molecule and has a urethane bond and a carboxyl group in its molecule, (i) has a longer distance between cross-linked points because the photosensitive resin composition does not substantially have a radical polymerizable group in its molecule, and (ii) has excellent flexibility and a substrate after curing has a small warpage because the photosensitive resin composition has a urethane bond having excellent flexibility; the photosensitive resin composition has an excellent solubility in an alkaline aqueous solution, serving as a developing solution used in forming a fine pattern, because the photosensitive resin composition has a carboxyl group in its molecule. Further, by using resin having an urethane bond having a radical polymerizable group in a molecule, which is the (A5) component, in combination with the (A4) component, it is possible to keep both the flexibility and photosensitivity at a high level. Further, because the (B) cross-linked polymer particles cause a surface of a film to be rough, an applied film obtained from a photosensitive resin composition containing the (B) cross-linked polymer particles has excellent tack-free property after being dried, and, because the polymer particles are soft, the flexibility of the applied film is not reduced. Furthermore, the polymer particles are excellent in heat resistance and chemical resistance because the polymer particles have a cross-linking structure. Furthermore, if a filler component is highly filled, a cured film generally loses flexibility to endure repeated bending. Surprisingly, however, a photosensitive resin composition, prepared by combining the (A4) component, the (A5) component, and the (B) component with one another, has the excellent photosensitivity, and a cured film, which can be obtained from the photosensitive resin composition containing these components, becomes remarkably soft to thereby obtain an excellent folding endurance. The inventors of the present invention presume that a reason of this is as follows: since cross-linked polymer particles are organic filler, affinity between cross-linked polymer particles and the (A4) and (A5) components forming a matrix of a cured film is better than that between cross-linked polymer particles and an inorganic filler; and, because the (A4) component and the (A5) component are soaked into the cross-linked polymer particles through surfaces thereof, high adhesiveness can be obtained at an interface between the (A4) and (A5) components and the (B) component.

In the photosensitive resin composition of Embodiment B, a huge amount of the (B) cross-linked polymer particles is blended, so that the above excellent properties can be further enhanced.

<(A4) Resin which does not Substantially have Radical Polymerizable Group in Molecule and has Urethane Bond and Carboxyl Group in its Molecule>

The (A4) resin which does not substantially have a radical polymerizable group in its molecule and has a urethane bond and a carboxyl group in its molecule indicates a polymer which (i) does not substantially have a radical polymerizable group in its molecule, (ii) has a repeating unit having at least one urethane bond and a repeating unit having at least one carboxyl group in its molecule, and (iii) has a weight-average molecular weight of 1,000 or more but 1,000,000 or less based on polyethylene glycol.

Here, what is meant by "does not substantially have a radical polymerizable group in its molecule" is that the resin has no radical polymerizable group, such as a (meth)acryloyl group or a vinyl group, in its molecule or has one or few (meth)acryloyl groups provided that it does not prevent the effect of the present invention. The range in which the effect of the present invention is not prevented means that a value quantitated by measuring, as an iodine value, a radical polymerizable group in a molecule of the (A4) component is less than 5. The iodine value indicates an amount of halogen which is bonded with a test sample (100 g) when the test sample is reacted with halogen, and is expressed in terms of grams of iodine converted from the amount of halogen. The iodine value can be measured by a method defined in the JIS K0070.

A molecule weight of the (A4) component can be measured by, for example, the following method.

Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluting solvent: 30 mM LiBr+20 mM $H_3PO_4$ in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol)

It is preferable to adjust the weight-average molecular weight within the above range because the photosensitive resin composition obtains excellent alkali developability and a resultant cured film obtains excellent flexibility and excellent chemical resistance. If the weight-average molecular weight is 1,000 or less, the flexibility or the chemical resistance might decrease. Meanwhile, if the weight-average molecular weight is 1,000,000 or more, the alkali developability of the photosensitive resin composition might be decreased and viscosity thereof might be increased.

It is possible to measure, as an acid value, a carboxyl group content of the (A4) component. The acid value of the (A4) component is preferably set to 50 mgKOH/g to 200 mgKOH/ g, and more preferably 50 mgKOH/g to 150 mgKOH/g. If the acid value is less than 50 mgKOH/g, the alkali developability might be decreased, meanwhile, if the acid value is more than 200 mgKOH/g, a moisture-absorption property of the cured film might be increased and electrical insulation reliability of the cured film might be decreased.

The (A4) component can be obtained by an arbitrary reaction. For example, by reacting a diol compound which is represented by the following general formula (9): General formula (9)

[Chem. 9]

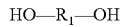  General formula (9)

(wherein $R_1$ represents a divalent organic group), a compound containing two hydroxy groups and one carboxyl group, which is represented by the following general formula (10):

[Chem. 10]

General formula (10)

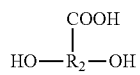

(wherein $R_2$ represents a trivalent organic group), and a diisocyanate compound which is represented by the following general formula (11):

[Chem. 11]

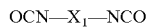  General formula (11)

(wherein $X_1$ represents a divalent organic group), the (A4) component can be obtained as a structure having a repeating unit having an urethane bond which is represented by the following general formula (12):

[Chem. 12]

General formula (12)

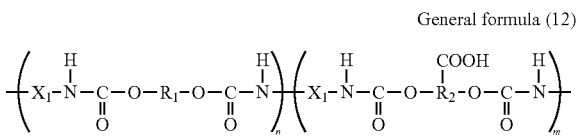

(wherein $R_1$ represents a divalent organic group, $R_2$ represents a trivalent organic group, $X_1$ represents a divalent organic group, n represents an integer of 1 or more, and m is an integer of 1 or more).

The diol compound is not particularly limited, provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol with polybasic acid; a polycarbonate diol having a carbonate skeleton; a polycaprolactone diol obtained by carrying out ring opening addition of lactones such as γ-butyl lactone, ε-caprolactone, and δ-valerolactone; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. Those compounds can be used solely, or two or more thereof can be used in combination.

It is particularly preferable to use a long chain diol, such as polyethylene glycol, polypropylene glycol, polytetra-methylene glycol, polyoxyalkylene diol, polyester diol, polycarbonate diol, or polycaprolactone diol. This is because a cured film, which is obtained by curing the photosensitive resin composition, is reduced in elasticity, obtains an excellent flexibility, and has a small warpage.

The compound having two hydroxyl groups and one carboxyl group is not particularly limited, provided that it has the above structure. Examples of the compound encompass 2,2-bis(hydroxymethyl)propionic acid, 2,2-bis(2-hydroxyethyl) propionic acid, 2,2-bis(3-hydroxymepropyl)propionic acid, 2,3-dihydroxy-2-methylpropionic acid, 2,2-bis(hydroxymethyl)butanoic acid, 2,2-bis(2-hydroxyethyl)butanoic acid, 2,2-bis(3-hydroxypropyl)butanoic acid, 2,3-dihydroxybutanoic acid, 2,4-dihydroxy-3,3-dimethylbutanoic acid, 2,3-dihydroxy hexadecanoic acid, 2,3-dihydroxy benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid. Those compounds can be used solely, or two or more thereof can be used in combination.

It is particularly preferable to use an aliphatic-based compound having two hydroxyl groups and one carboxyl group because the resultant photosensitive resin composition has an excellent photosensitivity.

The diisocyanate compound is not particularly limited, provided that it has the above structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. Those compounds can be used solely, or two or more thereof can be used in combination.

It is particularly preferable to use an alicyclic diisocyanate compound and an aliphatic diisocyanate compound because the photosensitive resin composition obtains excellent photosensitivity.

The (A4) component can be synthesized by the following method: specifically, a diol compound and a diisocyanate compound are mixed so that a ratio of the number of hydroxyl groups to the number of isocyanate groups is isocyanate groups/hydroxyl groups=0.5 or more but 2.0 or less; and the mixture is reacted without using a solvent or with use of an organic solvent.

Further, in the case where two or more of the diol compounds are used, the two or more of the diol compounds may be mixed and then reacted with the diisocyanate compound, or may be individually reacted with the diisocyanate compound. Further, such reaction may be also carried out in such a way that (i) a diol compound is initially reacted with the diisocyanate compound, (ii) a resultant terminal isocyanate compound is reacted with another diol compound, and (iii) a reactant is further reacted with the diisocyanate compound. In the case where two or more of the diisocyanate compounds are used, the reaction can be carried out similarly. In this way, a desired (A4) component can be prepared.

The reaction between the diol compound(s) and the diisocyanate compound(s) is carried out at a temperature of, preferably, 40° C. to 160° C., and more preferably 60° C. to 150° C. If the temperature is less than 40° C., it takes too much time for the reaction. Meanwhile, if the temperature is more than 160° C., a three-dimensional reaction occurs during the reaction, which easily causes gelatinization. How long the reaction is carried out can be determined appropriately depending on a batch scale and a reaction condition to be employed. The reaction may be carried out in the presence of a catalyst such as tertiary amines or a metal or semi-metal compound (for example, alkaline metal, alkaline earth metal, tin, zinc, titanium, or cobalt) as necessary.

The above reaction can be carried out without any solvent. However, in order to control the reaction, it is preferable to carry out the reaction with use of an organic solvent. Examples of the organic solvent encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, those organic polar solvents may be combined with aromatic hydrocarbon such as xylene or toluene as necessary.

Further examples of the organic solvent encompass: solvents of symmetric glycol diethers such as methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Among them, it is preferable to use the symmetric glycol diethers because the symmetric glycol diethers do not easily generate a side reaction.

It is desirable that the solvent used in the reaction be added so that a solute concentration by weight in a reactant solution, i.e., a concentration of the reactant solution is 5% by weight or more but 90% by weight or less. The solute concentration by weight in the reactant solution is more desirably 10% by weight or more but 80% by weight or less. If the concentration of the reactant solution is less than 5% by weight, it is difficult to cause a polymerization reaction and a reaction speed decreases. This may result in that a desired structural substance cannot be prepared. For this reason, the concentration of 5% by weight or less is not preferable.

<(A5) Resin which has Radical Polymerizable Group and Urethane Bond in Molecule>

The (A5) resin which has a radical polymerizable group and a urethane bond in its molecule indicates a polymer which (i) has a radical polymerizable group, in which a polymerization reaction is carried out by at least one radical polymerization initiator, and a urethane bond, and (ii) has a weight-average molecular weight of 1,000 or more but 100,000 or less based on polyethylene glycol.

It is preferable to adjust the weight-average molecular weight within the above range because the photosensitive resin composition obtains excellent alkali developability and a resultant cured film obtains excellent flexibility and excellent chemical resistance. If the weight-average molecular weight is 1,000 or less, the flexibility or the chemical resistance might decrease. Meanwhile, if the weight-average molecular weight is 100,000 or more, the alkali developability might be decreased and viscosity of the photosensitive resin composition might be increased.

The radical polymerizable group of the (A5) component preferably has an unsaturated double bond. Further, the unsaturated double bond is preferably a (meth)acryloyl group or a vinyl group. The radical polymerizable group contained in the (A5) component can be measured as an iodine value in the same way as that contained in the (A4) component. The iodine value of the (A5) component is preferably 10 to 200, and more preferably 50 to 150. If the iodine value is less than 10, the photosensitivity of the photosensitive resin composition might be reduced. Meanwhile, if the iodine value is more than 200, a cross-linked density might be increased because of too many photosensitive groups, the flexibility of a resultant cured film might be deteriorated, and warpage of the cured film might be increased.

The (A5) component is not particularly limited provided that it is urethane-bond containing resin having a radical polymerizable group in its molecule, and, for example, urethane (meth)acrylate resin and urethane-modified epoxy (meth)acrylate resin are preferable because a resultant cured film has excellent folding endurance and reduced warpage.

The (A5) component of the present invention can be obtained by an arbitrary reaction. For example, urethane (meth)acrylate resin can be obtained by reacting: the diol compound represented by the general formula (9); the diisocyanate compound represented by the general formula (11); and (i) a compound having a hydroxy group and at least one (meth)acryloyl group, which compound is represented by the following general formula (13):

[Chem. 13]

General formula (13)

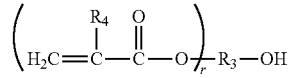

(wherein $R_3$ represents a (r+1) value organic group, $R_4$ represents hydrogen or an alkyl group, and r represents an integer of 1 to 3) and/or (ii) a compound having isocyanate group and at least one (meth)acryloyl group, which compound is represented by the following general formula (14):

[Chem. 14]

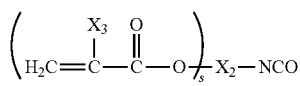

General formula (14)

(wherein $X_2$ represents a (s+1) value organic group, $X_3$ represents hydrogen or alkyl group, and s represents an integer of 1 to 3).

The diol compound is not particularly limited, provided that it has the above structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; bisphenol A; an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. Those compounds can be used solely, or two or more thereof can be used in combination.

It is particularly preferable to use a long chain diol, such as polyethylene glycol, polypropylene glycol, polytetra-methylene glycol, polyoxyalkylene diol, polyester diol, polycarbonate diol, or polycaprolactone diol. This is because a cured film, which is obtained by curing the photosensitive resin composition, is reduced in elasticity, obtains an excellent flexibility, and has a small warpage.

The diisocyanate compound is not particularly limited, provided that it has the above structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2'- or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. Those compounds can be used solely, or two or more thereof can be used in combination.

It is particularly preferable to use an alicyclic diisocyanate compound and an aliphatic diisocyanate compound because the photosensitive resin composition obtains an excellent photosensitivity.

The compound containing a hydroxyl group and at least one (meth)acryloyl group is not particularly limited provided that it has the above structure. Examples of the compound encompass 2-hydroxyethyl (meth)acrylate, 2-hydroxypropyl (meth)acrylate, 2-hydroxybutyl(meth)acrylate, 2-hydroxy-3-phenoxypropyl(meth)acrylate, 2-hydroxy-1-acryloxy-3-methacryloxy propan, o-phenylphenolglycidyl ether(meth)acrylate, polyethylene glycol mono(meth)acrylate, pentaerythritol tri(meth)acrylate, tris(2-hydroxyethyl)isocyanurate di(meth)acrylate, 1,4-cyclohexanedimethanol mono(meth)acrylate, 4-hydroxyphenyl (meth)acrylate, 2-(4-hydroxyphenyl)ethyl (meth)acrylate, N-methylolacrylamide, and 3,5-dimethyl-4-hydroxybenzyl acrylamide. Those compounds can be used solely, or two or more thereof can be used in combination.

The compound containing an isocyanate group and at least one (meth)acryloyl group is not particularly limited, provided that it has the above structure. Examples of the compound encompass 2-(meth)acryloyloxyethyl isocyanate, 1,1-bis (acryloyloxymethyl)ethyl isocyanate, and 2-(2-methacryloyloxyethyloxy)ethyl isocyanate. Those compounds can be used solely, or two or more thereof can be used in combination.

The (A5) component can be synthesized by the following method: specifically, a diol compound, a diisocyanate compound, and a compound having a hydroxy group and at least one (meth)acryloyl group and/or a compound having an isocyanate group and at least one (meth)acryloyl group are mixed so that a ratio of the number of hydroxyl groups to the number of isocyanate groups is isocyanate groups/hydroxyl groups=0.5 or more but 2.0 or less; and the mixture is reacted without using a solvent or with use of an organic solvent.

In the case where two or more of the diol compounds are used, the two or more of the diol compounds may be mixed and then the mixture may be reacted with the diisocyanate compound, or the two or more of the diol compounds may be individually reacted with the diisocyanate compound. Further, such a reaction may be also carried out in such a way that (i) a diol compound is initially reacted with the diisocyanate compound, and (ii) a resultant terminal isocyanate compound is further reacted with a compound having hydroxy group and at least one (meth)acryloyl group. Further, in the case where two or more of the diisocyanate compounds are used, the two or more of the diisocyanate compounds may be mixed and then reacted with a diol compound, or the two or more of the diisocyanate compounds may be individually reacted with the diol compound. Further, the diol compound and the two or more of the diisocyanate compounds may be reacted, a resultant terminal hydroxyl group compound may be further reacted with a compound having a isocyanate and at least one (meth)acryloyl group. In this way, a desired (A5) component can be manufactured.

The reaction between the diol compound(s) and the diisocyanate compound(s) is carried out at a temperature of, preferably, 40° C. to 160° C., and more preferably 60° C. to 150° C. If the temperature is less than 40° C., it takes too much time for the reaction. If the temperature is more than 160° C., a three-dimensional reaction occurs during the reaction, which easily causes gelatinization. How long the reaction is carried out can be determined appropriately depending on a batch scale and a reaction condition to be employed. The reaction may be carried out in the presence of a catalyst such as tertiary amines or a metal or semi-metal compound (for example, alkaline metal, alkaline earth metal, tin, zinc, titanium, or cobalt) as necessary.

The above reaction can be carried out without any solvent. However, in order to control the reaction, it is preferable to carry out the reaction with use of an organic solvent. Examples of the organic solvent encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, those organic polar solvents may be combined with aromatic hydrocarbon such as xylene or toluene as necessary.

Further examples of the organic solvent encompass: solvents of symmetric glycol diethers such as methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Among them, it is preferable to use the symmetric glycol diethers because the symmetric glycol diethers do not easily generate a side reaction.

It is desirable that the solvent used in the reaction be added so that a solute concentration by weight in a reactant solution, i.e., a concentration of the reactant solution is 5% by weight or more but 90% by weight or less. The solute concentration by weight in the reactant solution is more desirably 10% by weight or more but 80% by weight or less. If the concentration of the reactant solution is 5% by weight or less, it is difficult to cause a polymerization reaction and a reaction speed decreases. This may result in that a desired structural substance cannot be prepared. For this reason, the concentration of 5% by weight or less is not preferable.

Further, examples of the urethane-modified epoxy (meth) acrylate resin encompass KAYARAD UXE-3000 and UXE-3024 (trade name) manufactured by Nippon Kayaku Co., Ltd.

As the (A5) component, those components can be used solely, or two or more thereof can be used in combination.

A content of the (A5) component is preferably 10 parts by weight to 200 parts by weight, and more preferably 10 parts by weight to 100 parts by weight with respect to 100 parts by weight of the (A4) component. This is because the resolution of a fine pattern obtained from the photosensitive resin composition is excellent, and the resultant cured film is excellent in flexibility and chemical resistance.

The cured film formed from the photosensitive resin composition of Embodiment B is excellent in flexibility, flame retardancy, and electrical insulation reliability, and a substrate after curing has a small warpage.

[Embodiment C]

A photosensitive resin composition of Embodiment C contains a (E) phosphoric flame retardant, which is a flame retardant that is not substantially soluble in an organic solvent, and an (F) organic solvent.

The inventors of the present invention found that the photosensitive resin composition of Embodiment C had excellent various properties, and presume that reasons of this are specifically as follows: because the (B) cross-linked polymer particles cause a surface of a film to be rough, an applied film obtained from a photosensitive resin composition containing the (B) cross-linked polymer particles has excellent tack-free property after being dried, and, because the polymer particles are soft, the flexibility of the applied film is not reduced. Furthermore, the polymer particles are excellent in heat resistance and chemical resistance because the polymer particles have a cross-linking structure. Furthermore, if a filler component is highly filled, a cured film generally loses flexibility to endure repeated bending. Surprisingly, however, the cured film, prepared by combining the (A) binder polymer with the (B) cross-linked polymer particles, becomes remarkably soft to thereby obtain excellent folding endurance. The inventors of the present invention presume that a reason of this is as follows: because the (B) cross-linked polymer particles have oil absorbency, the (A) binder polymer forming a matrix of a cured film is soaked into the (B) cross-linked polymer particles, which results in high adhesiveness at an interface between the (A) binder polymer and the (B) cross-linked polymer particles, and therefore the applied film does not lose softness and the folding endurance even if the applied film contains the (E) phosphoric flame retardant (which is a flame retardant that does not substantially soluble in an organic solvent). Further, because the (E) phosphoric flame retardant exists in the photosensitive resin composition as, for example, a filler, a resultant cured film is excellent in heat resistance, chemical resistance, and electrical insulation reliability, and prevents bleeding out of a flame retardant component from the cured film.

In the photosensitive resin composition of Embodiment C, a huge amount of the (B) cross-linked polymer particles is blended, so that the above excellent properties can be further enhanced.

The flame retardant which is not substantially soluble in an organic solvent means a compound which (i) exists as a solid in the organic solvent while not being dissolved, (ii) has an effect of suppressing combustion of an organic substance, and (iii) is solid at a room temperature.

What is meant by "is not substantially soluble" is that the flame retardant is not soluble in an organic solvent at all, or is soluble provided that it does not prevent the effect of the present invention. The range in which the effect of the present invention is not prevented means that a weight of the flame retardant that is soluble in 100 parts by weight of the organic solvent at a room temperature is less than 0.1 part by weight.

While a method of measuring the weight (parts by weight) of the flame retardant soluble in 100 parts by weight of the organic solvent at the room temperature is, but not particularly limited, for example, the weight may be measured as follows: 1 part by weight of a flame retardant is added to 100 parts by weight of an organic solvent, and the resultant mixture is stirred at 40° C. for an hour; the mixture is cooled to a room temperature and let stand for 24 or more hours; the mixture is filtered under a reduced pressure with use of a PTFE membrane filter having a pore size of 0.45 μm, and the PTFE membrane filter is washed three times with the same organic solvent; the filter is dried at 60° C. under a reduced pressure for 8 hours, and a weight change of the filter is measured.

While the (E) phosphoric flame retardant which is not substantially soluble in the organic solvent is not particularly limited, for example, examples of the (E) phosphoric flame retardant encompass aluminum tris(diethyl phosphinate), aluminum tris(methylethyl phosphinate), aluminum tris (diphenyl phosphinate), zinc bis(diethyl phosphinate), zinc bis(methylethyl phosphinate), zinc bis(diphenyl phosphinate), titanyl bis(diethyl phosphinate), titanyl bis(methylethyl phosphinate), titanyl bis(diphenyl phosphinate), and melamine polyphosphate. Those phosphinates can be used solely, or two or more thereof can be used in combination.

While the (F) organic solvent is not particularly limited, examples of the (F) organic solvent encompass organic solvents described in <(A) Binder polymer> in Embodiment A.

A cured film formed from the photosensitive resin composition, of Embodiment C, containing the (F) organic solvent is excellent in flexibility, flame retardancy, and electrical insulation reliability, and has a small warpage after curing.

[Embodiment D]

A photosensitive resin composition of Embodiment D can also contains a (G) coloring agent.

The inventors of the present invention found that the photosensitive resin composition, of Embodiment D, containing the (G) coloring agent had excellent various properties, and presume that reasons of this are specifically as follows: because the (B) cross-linked polymer particles cause a surface of a film to be rough, an applied film obtained from a photosensitive resin composition containing the (B) cross-linked polymer particles has excellent tack-free property after being dried, and gloss of the applied film can be reduced, and, because the polymer particles are soft, the flexibility of the applied film is not reduced. Furthermore, the polymer particles are excellent in heat resistance and chemical resistance because the polymer particles have a cross-linking structure. Furthermore, if a filler component is highly filled, a cured film generally loses flexibility to endure repeated bending. Surprisingly, however, the cured film, prepared by combining the (A) binder polymer with the (B) cross-linked polymer particles, becomes remarkably soft to thereby obtain excellent folding endurance. The inventors of the present invention presume that a reason of this is as follows: because the (A) component forming a matrix of a cured film is soaked into the (B) component, high adhesiveness can be obtained at an interface between the (A) component and the (B) component). Further, even if the (G) coloring agent is used, the (B) component is combined with the (G) coloring agent, whereby the (B) component exerts a stress reduction effect in a cured film. Therefore the cured film can have the folding endurance which can endure repeated bending.

In the photosensitive resin composition of Embodiment D, a huge amount of the (B) cross-linked polymer particles is blended, so that the above excellent properties can be further enhanced.

Specific color of the (G) coloring agent is not particularly limited, and may be, for example, a (G1) black coloring agent, a (G2) white coloring agent, or any other color coloring agent.

The (G1) black coloring agent of the present invention is a substance which colors another substance black, such as a black dye and a black pigment, and is preferably a black pigment in view of colorability and heat resistance. While the black pigment is not particularly limited, examples of the black pigment encompass carbon black, lamp black, titanium black, graphite, iron oxide, copper oxide, cobalt oxides, nickel oxide, a complex oxide of iron and manganese, a complex oxide of iron, cobalt, and chromium, a complex oxide of iron, chromium, and manganese, a complex oxide of copper and chromium, a complex oxide of copper, chromium, and manganese, aniline compounds, anthraquinone compounds, and perylene compounds. Those compounds can be used solely, or two or more thereof can be used in combination. Among them, carbon black is particularly preferable because of high colorability and a high hiding property.

While the (G2) white coloring agent of the present invention is not particularly limited, examples of the (G2) white coloring agent encompass titanium oxide, zinc oxide, magnesium oxide, zirconium oxide, aluminum oxide, barium sulfate, silica, talc, mica, aluminium hydroxide, calcium silicate, aluminium silicate, and hollow resin particles. Those coloring agents can be used solely, or two or more thereof can be used in combination. Among them, titanium oxide is particularly preferable because of high colorability and reflectivity. Further, rutile-type titanium dioxide is preferable because the rutile-type titanium oxide is excellent in colorability, hiding property, and stability.

Rutile-type titanium oxide in the present invention is an oxide of titanium having a tetragonal crystal structure and is an inorganic compound represented by a composition formula $TiO_2$. While a method of manufacturing the rutile-type titanium oxide is not particularly limited, for example, a so-called sulfic acid method, in which a solution of titanium sulfate is hydrolyzed and a resultant hydrous titanium oxide is baked, or a so-called chlorine method, in which halogenated titanium is subjected to gas phase oxidation, can be employed.

In the case of manufacturing titanium oxide by the sulfic acid method, for example, a metal such as zinc, potassium, aluminium, lithium, niobium, or magnesium, or a compound such as a phosphorus compound may be added as a treating agent for baking. Meanwhile, in the case of manufacturing titanium oxide by the chlorine method, for example, a compound such as a compound of aluminum or potassium may be added as a treating agent in an oxidation step of titanium tetrachloride.

In particular, it is preferable to use titanium oxide manufactured by the chlorine method because a resultant cured film, formed from the photosensitive resin composition, is excellent in reflectivity and hiding property, is not easily discolored even at a high temperature or when being radiated with light, and prevents reduction in reflectivity.

Specific examples of the rutile-type titanium oxide encompass: TIPAQUE (trade name) R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-501A, and PT-501R, manufactured by ISHIHARA SANGYO KAISHA, LTD.; trade name R-3L, R-5N, R-7E, R-11P, R-21, R-25, R-32, R-42, R-44, R-45M, R-62N, R-310, R-650, SR-1, D-918, GTR-100, FTR-700, and TCR-52, manufactured by Sakai Chemical Industry Co., Ltd.; trade name JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, and MT-700HD, manufactured by TAYCA CORPORATION; trade name KR-310, KR-380, and KR-380N, manufactured by Titan Kogyo, Ltd.; trade name TR-600, TR-700, TR-750, TR-840, and TR-900 manufactured by Fuji Titanium Industry Co., Ltd., however, the rutile-type titanium oxide is not limited thereto.

A cured film formed from the photosensitive resin composition, of Embodiment D, containing the (G) coloring agent is excellent in hiding property, flexibility, flame retardancy, and electrical insulation reliability, and a substrate after curing has a small warpage.

EXAMPLES

Example A

The following description will discuss Examples of the present invention more specifically. It should be noted that the present invention is not limited to the Examples as below.

Synthesis Example 1

<(A) Binder Polymer 1>

Into a reaction vessel equipped with a stirrer, a thermometer, a dropping funnel, and a nitrogen-introducing inlet tube, 100.0 g of methyltriglym (=1,2-bis(2-methoxyethoxy)ethane) was added as a solvent for polymerization and heated to 80° C. under stirring in a nitrogen stream. Then, a mixture of 12.0 g (0.14 mol) of methacrylate, 28.0 g (0.16 mol) of benzyl methacrylate, 60.0 g (0.42 mol) of butyl methacrylate, and, as a radical polymerization initiator, 0.5 g of azobisisobutyronitrile, which had been mixed in advance at room temperature, was dropped from a dropping funnel over 3 hours while being maintained at 80° C. After the dropping, the resultant reactant solution was heated to 90° C. under stirring, and the reactant solution was further reacted under stirring for 2 hours while being maintained at 90° C. By carrying out such reaction, a resin solution which does not substantially contain a (meth)acryloyl group in its molecule was obtained. The resin solution thus obtained had a solid content concentration of 50%, a weight-average molecular weight of 48,000, and a solid content acid value of 78 mgKOH/g. Note that the solid content concentration, the weight-average molecular weight, and the acid value were measured as follows.

<Solid Content Concentration>

A measurement was carried out in accordance with JIS K 5601-1-2. For a drying condition, a condition of 170° C.×1 hour was selected.

<Weight-Average Molecular Weight>

A measurement was carried out under the following conditions.

Device: Counterpart of HLC-8220GPC (Manufactured by TOSOH CORPORATION)
Column: Two TSK gel Super AWM-H (6.0 mm I.D.×15 cm) (Manufactured by TOSOH CORPORATION)
Guard column: TSK guard column Super AW-H (Manufactured by TOSOH CORPORATION)
Eluting solvent: 30 mM LiBr+20 mM $H_3PO_4$ in DMF
Flow rate: 0.6 mL/min
Column temperature: 40° C.
Detection condition: RI: polarity (+), Response (0.5 sec)
Sample concentration: Approximately 5 mg/mL
Reference standard: PEG (polyethylene glycol)

<Acid Value>

A measurement was carried out in accordance with JIS K 5601-2-1.

Synthesis Example 2

<(A) Binder Polymer 2>

Into a reaction vessel equipped with a stirrer, a thermometer, and a nitrogen-introducing inlet tube, 30.00 g of methyl triglym (=1,2-bis(2-methoxyethoxy)ethane) was added as a solvent for polymerization. Then, 10.31 g (0.050 mol) of norbornene diisocyanate was added and heated to 80° C. under stirring in a nitrogen stream so that norbornene diisocyanate was dissolved in the solvent. Into a resultant solution was added, over 1 hour, a solution in which (i) 50.00 g (0.025 mol) of polycarbonate diol (PCDL T5652 (product name), manufactured by Asahi Kasei Co., Ltd. and having a weight-average molecular weight of 2000) and (ii) 6.51 g (0.050 mol) of 2-hydroxyethyl methacrylate were dissolved in 30.00 g of methyl triglym. A resultant solution was stirred by heating at 80° C. for 5 hours to carry out a reaction. In this way, a resin solution having a urethane bond and a methacryloyl group in its molecule was prepared. The resin solution thus obtained had a solid content concentration of 53% and a weight-average molecular weight of 5,200. Note that the solid content concentration and the weight-average molecular weight were measured in the same manner as in Synthesis Example 1.

Synthesis Example 3

<(A) Binder Polymer 3>

Into a reaction vessel equipped with a stirrer, a thermometer, and a nitrogen-introducing inlet tube, 30.00 g of methyl triglym (=1,2-bis(2-methoxyethoxy)ethane) was added as a solvent for polymerization. Then, 10.31 g (0.050 mol) of norbornene diisocyanate was added and heated to 80° C. under stirring in a nitrogen stream so that norbornene diisocyanate was dissolved in the solvent. Into a resultant solution was added, over 1 hour, a solution in which (i) 50.00 g (0.025 mol) of polycarbonate diol (PCDL T5652 (product name), manufactured by Asahi Kasei Co., Ltd. and having a weight-average molecular weight of 2000) and (ii) 3.70 g (0.025 mol) of 2,2-bis(hydroxymethyl)butanate were dissolved in 30.00 g of methyl triglym. A resultant solution was stirred by heating at 80° C. for 5 hours to carry out a reaction. In this way, a resin solution having a urethane bond and a carboxyl group in its molecule was prepared. The resin solution thus obtained had a solid content concentration of 52%, a weight-average molecular weight of 5,600, and a solid content acid value of 22 mgKOH/g. Note that the solid content concentration, the weight-average molecular weight, and the acid value were measured in the same manner as in Synthesis Example 1.

Synthesis Example 4

<(A) Binder Polymer 4>

Into a reaction vessel equipped with a stirrer, a thermometer, and a nitrogen-introducing inlet tube, 40.00 g of methyl triglym (=1,2-bis(2-methoxyethoxy)ethane) was added as a solvent for polymerization. Then, 20.62 g (0.100 mol) of norbornene diisocyanate was added and heated to 80° C. under stirring in a nitrogen stream so that norbornene diisocyanate was dissolved in the solvent. Into a resultant solution was added, over 1 hour, a solution in which (i) 50.00 g (0.025 mol) of polycarbonate diol (PCDL T5652 (product name), manufactured by Asahi Kasei Co., Ltd. and having a weight-average molecular weight of 2000), (ii) 3.70 g (0.025 mol) of 2,2-bis(hydroxymethyl)butanate, and (iii) 13.02 g (0.100 mol) of 2-hydroxyethyl methacrylate were dissolved in 40.00 g of methyl triglym. A resultant solution was stirred by heating at 80° C. for 5 hours to carry out a reaction. In this way, a resin solution having a urethane bond, a carboxyl group, and a (meth)acryloyl group in its molecule was prepared. The resin solution thus obtained had a solid content concentration of 52%, a weight-average molecular weight of 8,600, and a solid content acid value of 18 mgKOH/g. Note that the solid content concentration, the weight-average molecular weight, and the acid value were measured in the same manner as in Synthesis Example 1.

Synthesis Example 5

<(A) Binder Polymer 5>
Into a reaction vessel equipped with a stirrer, a thermometer, and a nitrogen-introducing inlet tube, 35.00 g of methyl triglym (=1,2-bis(2-methoxyethoxy)ethane) was added as a solvent for polymerization. Then, 10.31 g (0.050 mol) of norbornene diisocyanate was added and heated to 80° C. under stirring in a nitrogen stream so that norbornene diisocyanate was dissolved in the solvent. Into a resultant solution was added, over 1 hour, a solution in which 50.00 g (0.025 mol) of polycarbonate diol (PCDL T5652 (product name), manufactured by Asahi Kasei Co., Ltd. and having a weight-average molecular weight of 2000) was dissolved in 35.00 g of methyl triglym. A resultant solution was heated at 80° C. for 2 hours under stirring. After the reaction, 15.51 g (0.050 mol) of 3,3',4,4'-oxydiphthalic acid dianhydride (hereinafter referred to as ODPA) was added to the resultant reactant solution. Then, the reactant solution was heated to 190° C. to carry out a reaction for 1 hour. A resultant solution was cooled down to 80° C., and 3.60 g (0.200 mol) of purified water was added to the resultant solution. After the water was added, a resultant solution was heated to 110° C. and refluxed by heating for 5 hours. In this way, a resin solution having a urethane bond, a carboxyl group, and an imide group in its molecule was prepared. The resin solution thus obtained had a solid content concentration of 53%, a weight-average molecular weight of 9,200, and a solid content acid value of 86 mgKOH/g. Note that the solid content concentration, the weight-average molecular weight, and the acid value were measured in the same manner as in Synthesis Example 1.

Examples 1 through 6

<Preparation of Photosensitive Resin Composition>
Each of the (A) binder polymers obtained in Synthesis Examples, (B) cross-linked polymer particles, (C) thermosetting resin, a (D) photo-polymerization initiator, a (E) phosphorous flame retardant, other components, and an organic solvent were added to prepare a photosensitive resin composition. Respective amounts of constituent raw materials in terms of a resin solid content and respective of the constituent raw materials are shown in Table 1. In Table 1, an amount of 1,2-bis(2-methoxyethoxy)ethane, which is a solvent, indicates a total amount including the solvent contained in a corresponding one of the resin solutions synthesized above. The photosensitive resin composition was prepared by first mixing components by use of a general stirring device having a stirring wing and then passing a resultant mixture through a triple-roll mill twice to obtain a uniform solution. Each photosensitive resin had a particle diameter of 10 μm or less as measured by use of a grindmeter. A mixed solution was completely defoamed in a defoaming device, and then subjected to the following evaluations.

TABLE 1

Unit: Part by Weight

|  |  | Ex. 1 | Ex. 2 | Ex. 3 | Ex. 4 | Ex. 5 | Ex. 6 |
|---|---|---|---|---|---|---|---|
| Component (A) | Binder polymer 1 | 42.0 | — | — | — | — | — |
|  | Binder polymer 2 | — | 18.0 | — | — | — | — |
|  | Binder polymer 3 | — | — | 42.0 | 42.0 | 42.0 | 42.0 |
|  | Binder polymer 4 | 18.0 | — | 18.0 | 18.0 | 18.0 | 18.0 |
|  | Binder polymer 5 | — | 42.0 | — | — | — | — |
| Component (B) | DAIMICBEAZ UCN-8070CM clear <1> | 35.0 | 35.0 | 35.0 | 18.0 | 60.0 | — |
|  | GANZ PEARL GB-05S <2> | — | — | — | — | — | 30.0 |
| Component (C) | TEPIC-SP <3> | 10.0 | 10.0 | 10.0 | 10.0 | 10.0 | 10.0 |
| Component (D) | IRUGACURE369 <4> | 3.0 | 3.0 | 3.0 | 3.0 | 3.0 | 3.0 |
| Component (E) | Exolit OP-935 <5> | 20.0 | 20.0 | 20.0 | 20.0 | 20.0 | 20.0 |
| Other Components | FANCRYL FA-321M <6> | 15.0 | 15.0 | 15.0 | 15.0 | 15.0 | 15.0 |
|  | Florene AC-2000 <7> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |
| (B) component content (parts by weight) of 100 parts by weight of (A) component | | 58.3 | 58.3 | 58.3 | 30 | 100 | 58.3 |
| (B) component content (parts by weight) of 100 parts by weight of (A2) component | | 194.4 | 194.4 | 194.4 | 100.0 | 333.3 | 194.4 |

<1> A product name of a cross-linked polymer particle having a urethane bond in its molecule, manufactured by Dainichiseika Color 86 Chemicals Mfg. Co., Ltd., average particle diameter: 7 μm
<2> A product name of a cross-linked polymethacrylic acid butyl cross-linked polymer particle, manufactured by Ganz Chemical Co., Ltd., average particle diameter 5 μm
<3> A product name of a multi-functional epoxy resin (triglycidyl isocyanurate) manufactured by Nissan Chemical Industries, Ltd.
<4> A product name of a photo-polymerization initiator manufactured by BASF Japan Ltd.
<5> A product name of phosphinate manufactured by Clariant (Japan) K. K.
<6> A product name of EO-modified bisphenol A dimethacrylate manufactured by Hitachi Chemical Co., Ltd.
<7> A product name of a butadiene defoaming agent manufactured by Kyoeisha Chemical Co., Ltd.

<Preparation of Applying Film on Polyimide Film>

With use of a Baker's applicator, each of the photosensitive resin compositions thus prepared was flow-cast and applied to a polyimide film (manufactured by Kaneka Corporation: 25NPI (trade name)) having a thickness of 25 μm in an area of 100 mm×100 mm so as to have a final dried film thickness of 20 μm, and dried at 80° C. for 20 minutes. Resultant films were then exposed to ultraviolet rays having an integrated exposure amount of 300 mJ/cm$^2$. Then, the films were developed by spraying a 1.0 weight % sodium carbonate aqueous solution heated at 30° C., at a spraying pressure of 1.0 kgf/mm$^2$ for 90 seconds. After the development, the films were washed with purified water sufficiently, and then cured by heating in an oven at 150° C. for 30 minutes. Thus, cured films of the respective photosensitive resin compositions were prepared on the polyimide film.

<Evaluation of Cured Film>

Evaluation in terms of the following items was carried out. Evaluation results are shown in Table 2.

(i) Photosensitivity

Photosensitivity was evaluated by observing a surface of a cured film prepared in the same manner as in the above <Preparation of applying film on polyimide film>. Note that exposure was carried out by placing a negative photomask having a line width/space width=100 μm/100 μm. The evaluation was based on definition as follows:

(I) "G (Good)" indicates a polyimide film in which a sensitive pattern of line width/space width=100/100 μm was formed on a surface thereof and the sensitive pattern has no notable bold line and no residue from development; and (II) "P (Poor)" indicates a polyimide film in which a sensitive pattern of line width/space width=100/100 μm was not formed on a surface thereof.

(ii) Tack-Free Property

With use of a Baker's applicator, each of the photosensitive resin compositions thus prepared was flow-cast and applied to a polyimide film (manufactured by Kaneka Corporation: 25NPI (trade name)) having a thickness of 25 μm in an area of 100 mm×100 mm so as to have a final dried film thickness of 20 μm, and dried at 80° C. for 20 minutes. In this way, an applied film after the solvent was dried was prepared. The tack-free property of the film thus applied was evaluated in the following manner. First, the polyimide film with the photosensitive resin composition film which had been subjected to drying of the solvent was cut out into strips of 50 mm×30 mm. A strip was laid on top of another strip so that surfaces of such films of the respective strips face inward and are in contact with each other. A load of 300 g was applied for 3 seconds to a portion where the strips overlapped each other, and the load was removed. The strips were then peeled off each other. In this state, the applied films were observed. The evaluation was based on definition as follows:

(I) "G (Good)" indicates that applied films were not adhered to each other and no mark of adhesion was left on the applied films;

(II) "U (Unsatisfactory)" indicates that applied films were slightly attached to each other and a mark of adhesion was left on the applied films; and (III) "P (Poor)" indicates that applied films were completely attached to each other and it was impossible to peel the applied films off each other.

(iii) Folding Endurance

In the same manner as in the above <Preparation of applying film on polyimide film>, cured-film-laminated films of the photosensitive resin compositions were formed to have a thickness of 20 μm on a surface of a polyimide film (Apical 25 NPI manufactured by Kaneka Corporation) having a thickness of 25 μm. The evaluation of the folding endurance of each of the cured-film-laminated films was carried out in the following manner. A cured-film-laminated film was cut out into strips of 50 mm×10 mm. Each of the strips was bent in half (at a point 25 mm from its edge) by 180° so that the cured film faced outward. A load of 5 kg was applied for 3 seconds to a portion where each of the strips was bent, and the load was removed. Then, apexes of the portion where each of the strips was bent were observed by use of a microscope. After the apexes were observed by use of the microscope, the portion where each of the strips was bent was opened. A load of 5 kg was applied to the portion again for 3 seconds and then removed, so that the cured-film-laminated film was completely opened. This operation was repeated, and how many times the bending was repeated before crack occurred in the portion where each of the strips was bent was counted as the number of bending. The evaluation was based on definition as follows:

(I) "G (Good)" indicates a cured film having no crack after 5 times of bending;

(II) "U (Unsatisfactory)" indicates a cured film having no crack after 3 times of bending; and (III) "P (Poor)" indicates a cured film having a crack after a first time of bending.

(iv) Electric Insulation Reliability

On a flexible copper-clad laminate (thickness of electrolyte copper foil: 12 μm, polyimide film: Apical 25 NPI manufactured by Kaneka Corporation; the copper foil was bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, in the same manner as in the above <Preparation of applying film on polyimide film>, a cured film of a photosensitive resin composition having a thickness of 20 μm was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was based on definition as follows:

(I) "G (Good)" indicates one in which 1000 hours after the start of the test, a resistance value was $10^8$ or more, and no occurrence of migration, formation of dendrites, or the like was observed; and (II) "P (Poor)" indicates one in which 1000 hours after the start of the test, an occurrence of migration, formation of dendrites, or the like was observed.

(v) Solder Heat Resistance

In the same manner as in the above <Preparation of applying film on polyimide film>, a cured-film-laminated film of each of the photosensitive resin compositions was formed to have a thickness of 20 μm on a surface of a polyimide film (manufactured by Kaneka Corporation, APICAL 75NPI) having a thickness of 75 μm. The cured-film-laminated film thus prepared was floated on a solder bath that was completely melted at 260° C. so that a surface of the cured-film-laminated film on which surface a cured film of the photosensitive resin composition was formed made contact with the solder bath. Ten seconds later, the cured-film-laminated film was pulled up. This operation was repeated three times, and the surface of the cured-film-laminated film was observed. The evaluation was based on definition as follows:

(I) "G (Good)" indicates an applied film (cured-film-laminated film) having no problem; and (II) "P (Poor)" indicates an applied film (cured-film-laminated film) having a problem such as swelling or detachment.

(vi) Warpage

In the same manner as in the above <Preparation of applying film on polyimide film>, a cured-film-laminated film of each of the photosensitive resin compositions was formed to have a thickness of 20 μm on a surface of a polyimide film (manufactured by Kaneka Corporation, APICAL 25NPI) having a thickness of 25 μm. The cured-film-laminated film thus obtained was cut out into a film having an area of 50 mm×50 mm, and the film was placed on a flat and smooth table so that an applied film (cured film) thereof turned up. Then, how much an end portion of the film was warped was measured. FIG. 1 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be 5 mm or less. Note that a film that rolled up into a cylinder was evaluated as "P (Poor)".

(vii) Flame Retardancy

A flame retardancy test was carried out as follows, in accordance with the UL94VTM standard for a flame retardancy test of plastic material. In the same manner as in the above <Preparation of applying film on polyimide film>, a cured-film-laminated film of each of the photosensitive resin compositions was prepared to have a thickness of 20 μm on both surfaces of a polyimide film (manufactured by Kaneka Corporation: APICAL 25NPI (trade name)) having a thickness of 25 μm. A prepared sample was cut out into a shape of 50 mm in width, 200 mm in length, and 75 μm in thickness (including the thickness of the polyimide film). Then, a marked line was formed on the sample at a point 125 mm from its edge and the sample was rolled into a cylinder having a diameter of about 13 mm. A PI tape was attached to the sample so that no gap was formed in an overlapping portion, of the sample, above the marked line (i.e., a 75-mm-long portion of the sample) and in an upper portion of the sample. In this way, 20 sample tubes for the flame retardancy test were prepared. Among them, 10 sample tubes were subjected to a treatment under a condition (1) (23° C./50% relative humidity/48 hours), while remaining 10 tubes were subjected to a treatment under a condition (2) (70° C., 168 hours) and cooled down in a desiccator filled with anhydrous calcium chloride for at least 4 hours. These samples were fixed upright by clamping their upper portions. Then, a burner was turned on and put closer to bottom portions of the samples for 3 seconds to ignite them. After 3 seconds passed, the burner was drawn from the samples, and it was measured how long it took for a flame or burning of each of the samples to be extinguished or to stop. Evaluation of the flame resistance was based on definition as follows:

(I) If, under each condition ((1), (2)), (A) samples automatically stopped burning and flames thereof were automatically extinguished within at least 10 seconds but at most 10 seconds on average (of 10 samples) after the burner was drawn away from the samples and (B) each of the samples burned with a flame not reaching an evaluation line of each of the samples, a photosensitive resin composition thereof was evaluated as "G (Good)"; and (II) If there was even one sample which did not stop burning within 10 seconds or which burned with a flame reaching an evaluation line of the sample, a photosensitive resin composition thereof was evaluated as "P (Poor)".

(viii) Elongation

A cured-film-laminated copper foil (thickness: 40 μm) of the photosensitive resin composition was formed on a surface of an electrolyte copper foil having a thickness of 12.5 μm in the same manner as in the above <Preparation of applying film on polyimide film>. The copper foil of the resultant cured-film-laminated copper foil of the photosensitive resin composition was etched out with use of a ferric chloride 40% aqueous solution, and a single-layer cured film of the photosensitive resin composition was prepared. With use of the cured film thus prepared, a tensile test was carried out to measure elongation in accordance with JIS K 7127.

(ix) Elasticity

A single-layer photosensitive resin composition cured film was prepared in the same manner as in the above (viii) Elongation. With use of a resultant cured film, a tensile test was carried out to measure the elasticity in accordance with JIS K 7127.

TABLE 2

| Evaluation Item | Ex. 1 | Ex. 2 | Ex. 3 | Ex. 4 | Ex. 5 | Ex. 6 | Com. Ex. 1 | Com. Ex. 2 | Com. Ex. 3 |
|---|---|---|---|---|---|---|---|---|---|
| Photosensitivity | G | G | G | G | G | G | G | G | G |
| Tack-free Property | G | G | G | G | G | G | P | G | P |
| Folding Endurance | G | G | G | G | G | G | G | P | G |
| Electric Insulation Reliability | G | G | G | G | G | G | P | G | G |
| Solder Heat Resistance | G | G | G | G | G | G | G | G | G |
| Warpage (mm) | 2.0 | 2.0 | 1.0 | 2.5 | 0.5 | 1.0 | 2.0 | P | 1.0 |
| Flame Retardancy | G | G | G | G | G | G | G | P | G |
| Elongation (%) | 24 | 42 | 54 | 23 | 64 | 28 | 21 | 3 | 36 |
| Elasticity (GPa) | 0.8 | 0.8 | 0.5 | 1.0 | 0.3 | 0.7 | 1.0 | 2.6 | 1.2 |

Comparative Example 1

Air was introduced into a reaction vessel equipped with a stirrer, a thermometer, a cooling tube, and an air-inlet tube. Subsequently, 196.80 g (0.39 mol) of polycarbonate diol (manufactured by Daicel Chemical Industries, Ltd., product name PLACCEL CD205PL, number-average molecular weight: 500), 58.30 g (0.39 mol) of 2,2-bis(hydroxymethyl) butanate, 37.60 g (0.35 mol) of diethylene glycol, 148.10 g (0.75 mol) of 1,4-cyclohexanedimethanol monoacrylate, 0.55 g of p-methoxyphenol, 0.55 g of dibutyltin dilaurate, and 110.20 g of methyl ethyl ketone were added into the reaction vessel and heated to 65° C. under stirring uniformly in an air stream. Into a dripping vessel, 305.90 g (1.46 mol) of trimethyl hexamethylene diisocyanate was added. Then, trimethyl hexamethylene diisocyanate was dropped from the dripping vessel into the reaction vessel over 3 hours under stirring uniformly at 65° C. After the dropping, the dripping vessel was washed by use of 76.50 g of methyl ethyl ketone. After the dripping vessel was washed, a solution in the dripping vessel was charged as it is into the reaction vessel, and a resultant mixture was kept stirred uniformly for 2 hours at that temperature, Then, the resultant mixture was heated to 75° C. and stirred uniformly for 5 hours. Next, 9.30 g of methanol was added into the reaction vessel and was stirred uniformly at 60° C. for 30 minutes. Subsequently, 56.40 g of methyl ethyl ketone was added thereto to give a transparent resin solution. In this manner, a resin solution having a urethane bond and a methacryloyl group in its molecule was prepared. The resin solution thus prepared had a solid content concentration of 75% and a weight-average molecular weight of 14,800. Note that the solid content concentration and the weight-average molecular weight were measured in the same manner as in Synthesis Example 1. Then, (i) 66.7 g (solid content 50 g) of the resin solution thus prepared, (ii) 30 g of 2,2'-bis(4-methacryloxypentaethoxy phenyl)propane which served as a radical polymerizable compound, (iii) 162.5 g (solid content 65 g) of a resin solution which served as a binder resin and was obtained by copolymerizing methacrylate, methyl methacrylate, and butyl acrylate in a weight ratio of 22:71:7 (a solution which had a weight-average molecular weight of 80,000 and a solid content acid value of 143 mgKOH/g and was obtained by dissolving methacrylate, methyl methacrylate, and butyl acrylate in a solution of methyl cellsolve/toluene=6/4 (weight ratio) so as to have a solid content concentration of 40%), (iv) 3.5 g of benzophenone and 0.1 g of N,N'-tetraethyl-4,4'-diaminobenzophenone, both of which served as a photo-polymerization initiator, (v) 20 g (solid content 15 g) of a 75% methyl ethyl ketone solution of a block isocyanate compound which served as a thermosetting resin and was obtained by reacting an isocyanurate type hexamethylene diisocyanate isocyanate compound and methylethyl ketone oxime which served as a blocking agent, (vi) 40 g of CR-747 (a name of a product manufactured by DAIHACHI CHEMICAL INDUSTRY CO., LTD.) which served as a phosphorous flame retardant, (vii) 85 g of acetone which served as a diluent were blended, stirred, and then dispersed by use of a triple-roll mill to prepare a photosensitive resin composition. Physical properties of the photosensitive resin composition thus prepared was evaluated in the same manner as in Example 1. Evaluation results are shown in Table 2. Note that the photosensitive resin composition does not contain the component (B).

Comparative Example 2

To 100.00 g of cresol novolac type epoxy resin YDCN-703 (manufactured by Tohto Kasei Co., Ltd., epoxy equivalent of 200), 80.00 g of carbitol acetate was added and heated to 120° C. under stirring so that carbitol acetate was dissolved in the epoxy resin. After a resultant solution was cooled down to 60° C., 43.48 g (solid content 20.00 g) of an emulsion (glass transition temperature −8° C., solid content 46.0%) of a (meth)acrylic ester polymer particle was added and heated to 130° C. under stirring, so that water was completely eliminated. Subsequently, 36.90 g of an acrylic acid, 0.14 g of chromic chloride hexahydrate, and 0.11 g of methylhydroquinone were added to carry out a reaction at 110° C. for 3 hours. An acid value of a reactant became 3.0 mgKOH/g, so that an introduction of an acryloyl group was confirmed. Next, 45.60 g of tetrahydrophthalic anhydride, 29.00 g of ethyl carbitol acetate, and 0.14 g of lithium chloride anhydrous were added to react at 100° C. for 3 hours to prepare a mixed resin solution of the reactant and ethyl carbitol acetate, which mixed resin solution contained 6.4% of a (meth)acrylic ester polymer particle and 58.6% of a photo-curable resin having an acid value of 90 mgKOH/g. Then, 90 g (solid content: polymer particle 5.8 g and photo-curable resin 52.7 g) of a resultant resin solution, 15.0 g of pentaerythritol tetraacrylate which served as a multi-functional monomer, 20.0 g of ethyl carbitol acetate which served as a diluent, 8.0 g of IRGACURE 907 (a trade name of a product manufactured by BASF Japan Ltd.) which served as a photo-polymerization initiator, 20.0 g of a phenol novolac type epoxy resin which served as a thermosetting resin, 2.0 g of dicyandiamide which served as an epoxy curing agent, 30.0 g of barium sulfate which served as a filler, 1.2 g of Florene AC300 (a name of a product manufactured by Kyoeisha Chemical Co., Ltd.) which served as defoaming agent, and 0.6 g of phthalocyanine green which served as a pigment were blended, stirred, and dispersed by use of a triple-roll mill to prepare a photosensitive resin composition. Physical properties of the photosensitive resin composition thus obtained were evaluated in the same manner as in Example 1. Evaluation results are shown in Table 2. Note that the photosensitive resin composition does not contain the component (E). Further, a content of the (B) component is 11.0 parts by weight with respect to 100 parts by weight of photo-curable resin having (meth) acryloyl group in its molecule.

Comparative Example 3

Cross-linked polymer fine particles (manufactured by Ganz Chemical Co., Ltd.; staphyloid AC-3816 (trade name); average particle diameter of 0.5 μm) having a core shell multilayer structure was used instead of DAIMIC BEAZ UCN-8070CM clear in Example 3, and physical properties were evaluated in the same manner as in Example 1. Evaluation results are shown in Table 2.

Example B

<(A) Binder Polymers 1-5>

Example B used a binder polymer same as the (A) binder polymers 1-5 used in Example 1. The methods of synthesizing the (A) binder polymers 1-5 have been already described, and therefore detailed description thereof is omitted.

Examples 7-12

<Preparation of Photosensitive Resin Composition (Black)>

(A) binder polymers, a (B) cross-linked polymer particle, a (C) thermosetting resin, a (D) photo-polymerization initiator, a (E) phosphorous flame retardant, a (G) coloring agent (black), other components, and an organic solvent were added to prepare a black photosensitive resin composition. Respective amounts of constituent raw materials in terms of a resin solid content and the constituent raw materials are shown in Table 3. In the table, an amount of 1,2-bis(2-methoxyethoxy) ethane, which is a solvent, indicates a total amount including the solvent contained in a corresponding one of the resin solutions synthesized above. The black photosensitive resin composition was prepared by first mixing components by use of a general stirring device having a stirring wing and then passing a resultant mixture through a triple-roll mill twice to obtain a uniform solution. Each photosensitive resin had a particle diameter of not more than 10 μm as measured by use of a grindmeter. A mixed solution was completely defoamed in a defoaming device, and then subjected to the following evaluations.

TABLE 3

Unit: Part by Weight

|  |  | Ex. 7 | Ex. 8 | Ex. 9 | Ex. 10 | Ex. 11 | Ex. 12 |
|---|---|---|---|---|---|---|---|
| Component (A) | Binder polymer 1 | 42.0 | — | — | — | — | — |
|  | Binder polymer 2 | — | 18.0 | — | — | — | — |
|  | Binder polymer 3 | — | — | 42.0 | 42.0 | 42.0 | 42.0 |
|  | Binder polymer 4 | 18.0 | — | 18.0 | 18.0 | 18.0 | 18.0 |
|  | Binder polymer 5 | — | 42.0 | — | — | — | — |
| Component (B) | DAIMICBEAZ UCN-8070CM clear <1> | 30.0 | 30.0 | 30.0 | 18.0 | 60.0 | — |
|  | GANZ PEARL GB-05S <2> | — | — | — | — | — | 30.0 |
| Component (C) | TEPIC-SP <3> | 10.0 | 10.0 | 10.0 | 10.0 | 10.0 | 10.0 |
| Component (D) | IRUGACURE OXE-02 <4> | 1.0 | 1.0 | 1.0 | 1.0 | 1.0 | 1.0 |
| Component (E) | Exolit OP-935 <5> | 20.0 | 20.0 | 20.0 | 20.0 | 20.0 | 20.0 |
| Component (G) | #2600 <6> | 2.0 | 2.0 | 2.0 | 2.0 | 2.0 | 2.0 |
| Other Components | FANCRYL FA-321M <17> | 15.0 | 15.0 | 15.0 | 15.0 | 15.0 | 15.0 |
|  | Florene AC-2000 <8> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |
| (B) component content (parts by weight) of 100 parts by weight of (A) component |  | 50 | 50 | 50 | 30 | 100 | 50 |

<1> A product name of a cross-linked polymer particle having a urethane bond in its molecule, manufactured by Dainichiseika Color 86 Chemicals Mfg. Co., Ltd. Average particle diameter: 7 μm <2> A product name of a cross-linked polymethacrylic acid butyl cross-linked polymer particle, manufactured by Ganz Chemical Co., Ltd., average particle diameter: 5 μm <3> A product name of a multi-functional epoxy resin (triglycidyl isocyanurate) manufactured by Nissan Chemical Industries, Ltd.

<4> A product name of an oxime ester photo-polymerization initiator manufactured by BASF Japan Ltd.

<5> A product name of a phosphorous flame retardant (diethylphosphinic acid alminium salt, average particle diameter of 2.5 μm, manufactured by Clariant (Japan) K. K.

<6> A product name of black coloring agent (carbon black), manufactured by Mitsubishi Chemical Corporation <7> A product name of EO-modified bisphenol A dimethacrylate manufactured by Hitachi Chemical Co., Ltd.

<8> A product name of a butadiene defoaming agent manufactured by Kyoeisha Chemical Co., Ltd.

<Preparation of Applying Film on Polyimide Film>

With use of a Baker's applicator, each of the black photosensitive resin compositions thus prepared was flow-cast and applied to a polyimide film (manufactured by Kaneka Corporation: trade name 25NPI) having a thickness of 25 μm in an area of 100 mm×100 mm so as to have a final dried film thickness of 20 μm, and dried at 80° C. for 20 minutes. Resultant films were then exposed to ultraviolet rays having an integrated exposure amount of 300 mJ/cm². Then, the films were developed by spraying a 1.0 weight % sodium carbonate aqueous solution heated at 30° C., at a spraying pressure of 1.0 kgf/mm² for 90 seconds. After the development, the films were washed with purified water sufficiently, and then cured by heating in an oven at 150° C. for 30 minutes. Thus, cured films of the black respective photosensitive resin compositions were prepared on the polyimide film.

<Evaluation of Cured Film>

The (i) photosensitivity, the (ii) tack-free property, the (iii) folding endurance, the (iv) electrical insulation reliability, the (v) solder heat resistance, the (vi) warpage, the (vii) flame retardancy, and the (viii) hiding property were evaluated. Evaluation results are shown in Table 4.

The methods of evaluating items other than the (viii) hiding property have been already described in [Example 1], and therefore detailed description thereof is omitted. The following description will discuss a method of evaluating the (viii) hiding property.

(viii) Hiding Property

A test piece, obtained in the above (vi) Warpage, was placed on a graph paper ruled into 1-millimeter squares, and a square on which the test piece was placed was visually checked. Evaluation of the hiding property was based on definition as follows:

(I) "G (Good)" indicates the square was not visually checked; and (II) "P (Poor)" indicates the square was visually checked.

TABLE 4

| Evaluation Item | Ex. 7 | Ex. 8 | Ex. 9 | Ex. 10 | Ex. 11 | Ex. 12 | Com. Ex. 4 | Com. Ex. 5 | Com. Ex. 6 |
|---|---|---|---|---|---|---|---|---|---|
| Photosensitivity | G | G | G | G | G | G | G | G | G |
| Tack-free Property | G | G | G | G | G | G | P | P | G |
| Folding Endurance | G | G | G | G | G | G | P | G | P |
| Electric Insulation Reliability | G | G | G | G | G | G | G | P | G |
| Solder Heat Resistance | G | G | G | G | G | G | G | G | G |
| Warpage (mm) | 1.0 | 1.0 | 0.5 | 1.3 | 0.2 | 0.5 | P | 2.0 | P |
| Flame Retardancy | G | G | G | G | G | G | P | P | P |
| Hiding Property | G | G | G | G | G | G | G | G | P |

Comparative Example 4

Air was introduced into a reaction vessel equipped with a stirrer, a thermometer, a cooling tube, and an air-inlet tube. Subsequently, 210.0 g of cresol novolac type epoxy resin (manufactured by manufactured by DIC Corporation, EPICLON N-680 (product name), epoxy equivalent of 210) and 96.4 g of carbitol acetate were added and heated so that the carbitol acetate were dissolved in the cresol novolac type epoxy resin. Then, 0.46 g of hydroquinone as a polymerization inhibitor and 1.38 g of triphenylphosphine as a catalyst were added, and were heated to 95° C. under stirring uniformly in an air stream. Thereafter, 72.0 g of acrylic acid was added to a dripping vessel, and the acrylic acid was dropped to a reaction vessel while being heated to 95° C. to 105° C. After the dropping, the acrylic acid was reacted for about 16 hours until the acid value became 3.0 KOHmg/g. Then, a resultant reactant solution was cooled to 80° C. to 90° C., and 76.0 g of tetrahydrophtalic anhydride was added. The resultant mixture was reacted for 8 hours to obtain a resin solution. In this way, a resin solution containing photo-curable resin was prepared. The resin solution thus obtained had a solid content concentration of 65% and an acid value of 78 KOHmg/g. Note that the solid content concentration and the acid value were measured in the same manner as in Synthesis Example 1. The resultant resin solution 154 g (100 g as a solid content), dipentaerythritol hexaacyrlate 18 g as a radical polymerizable compound, 2-methyl-1-[4-(methylthio)phenyl]-2-morpholinopropane-1-on (manufactured by BASF Japan Ltd., IRGACURE 907 (product name)) 15 g as a photo-polymerization initiator, 2,4-diethylthioxanthone 1 g, and 4,4'-bis(dimethylamino)benzophenone 0.1 g, bisphenol A diglycidyl ether 25 g and triglycidyl isocyanurate 15 g as polyfunctional epoxy resin, carbon black (manufactured by Mitsubishi Chemical Corporation, product name carbon black M-50) 2.2 g, melamine 5 g as a curing catalyst, silicone defoaming agent 3 g, organic bentonite 3 g, barium sulfate 140 g, and diethylene glycol monoethyl ether acetate 18 g were blended and stirred, and the resultant mixture was dispersed by triple-roll mill. Thus the black photosensitive resin composition was obtained. The physical properties of the black photosensitive resin composition were evaluated in the same manner as in Example 7. Evaluation results are shown in Table 4. Note that the black photosensitive resin composition does not contain the (B) component and the (E) component.

Comparative Example 5

A resin solution (weight-average molecular weight: 110,000, acid value of solid content: 110 mgKOH/g, a solution obtained by dissolving methacrylate, methyl methacrylate, and butyl acrylate in a solution of methyl cellsolve/toluene=6/4 (weight ratio) so as to have a solid content concentration of 40%) 150 g (60 g as a solid content) as a binder resin, which solution was obtained by copolymerizing methacrylate, methyl methacrylate, and butyl acrylate in a weight ratio of 17:62:21, urethane modified epoxy acrylate resin (manufactured by Nippon Kayaku Co., Ltd.; KAYARAD UXE-3024 (product name); solid content concentration: 65%; weight-average molecular weight: 10,000; acid value of solid content: 60 mgKOH/g) 15.4 g (10 g as a solid content) as resin having a urethane bond and urethane/unsaturated olygomer (photopolymerizable compound which was prepared by reacting 3 moles of a polycarbonate compound having a hydroxyl group at its end, 4 moles of isophorone diisocyanate, and 2 moles of 2-hydroxyethyl acrylate) 45 g as a solid content, carbon black as a black pigment 1.5 g, bisphenol A skeleton ethylene oxide modified dimethacrylate 30 g as a radical polymerizable compound, 2-benzyl-2-dimethylamino-1-(4-morpholiophenyl)-butanone-1 (manufactured by BASF Japan Ltd., IRGACURE 369 (product name)) 2.5 g as a photo-polymerization initiator, a melamine derivative 17 g as thermosetting resin, methyl ethyl ketone 45 g as another component, and toluene 20 g were mixed and stirred, and then were dispersed by use of a triple-roll mill to prepare a black photosensitive resin composition. Physical properties of the black photosensitive resin composition were evaluated in the same manner as in Example 7. Evaluation results are shown in Table 4. Note that the black photosensitive resin composition does not contain the (B) component and the (E) component.

Comparative Example 6

To 100.00 g of cresol novolac type epoxy resin YDCN-703 (manufactured by Tohto Kasei Co., Ltd., epoxy equivalent of 200), 80.00 g of carbitol acetate was added and heated to 120° C. under stirring so that carbitol acetate was dissolved in the epoxy resin. After a resultant solution was cooled down to 60° C., 43.48 g (solid content 20.00 g) of an emulsion (glass transition temperature −8° C., solid content 46.0%) of a (meth)acrylic ester polymer particle was added and heated to 130° C. under stirring, so that water was completely eliminated. Subsequently, 36.90 g of an acrylic acid, 0.14 g of chromic chloride hexahydrate, and 0.11 g of methylhydroquinone were added to carry out a reaction at 110° C. for 3 hours. An acid value of a reactant became 3.0 mgKOH/g, so that an introduction of an acryloyl group was confirmed. Next, 45.60 g of tetrahydrophthalic anhydride, 29.00 g of ethyl carbitol acetate, and 0.14 g of lithium chloride anhydrous were added to react at 100° C. for 3 hours to prepare a mixed resin solution of the reactant and ethyl carbitol acetate, which mixed resin solution contained 6.4% of a (meth)acrylic ester polymer particle and 58.6% of a photo-curable resin having an acid value of 90 mgKOH/g. Then, 90 g (solid content: polymer particle 5.8 g and photo-curable resin 52.7 g) of a resultant resin solution, 15.0 g of pentaerythritol tetraacrylate which served as a multi-functional monomer, 20.0 g of ethyl carbitol acetate which served as a diluent, 8.0 g of IRGACURE 907 (a trade name of a product manufactured by BASF Japan Ltd.) which served as a photo-polymerization initiator, 20.0 g of a phenol novolac type epoxy resin which served as a thermosetting resin, 2.0 g of dicyandiamide which served as an epoxy curing agent, 30.0 g of barium sulfate which served as a filler, 1.2 g of Florene AC300 (a name of a product manufactured by Kyoeisha Chemical Co., Ltd.) which served as defoaming agent, and 0.6 g of phthalocyanine green which served as a pigment were blended, stirred, and dispersed by use of a triple-roll mill to prepare a photosensitive resin composition. Physical properties of the photosensitive resin composition thus obtained were evaluated in the same manner as in Example 7. Evaluation results are shown in Table 4. Note that the photosensitive resin composition does not contain the component (E) and the component (G).

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

Industrial Applicability

The present invention is applicable to a resin film, an insulating film, a printed wiring board provided with an insulating film, and the like.

REFERENCE SIGNS LIST

1: Polyimide film laminated with photosensitive resin composition
2: Amount of warpage
3: Flat and smooth table

The invention claimed is:

1. A photosensitive resin composition, comprising at least
(A) binder polymer;
(B) cross-linked polymer particles;
(C) thermosetting resin;
(D) photo-polymerization initiator; and
(E) phosphoric flame retardant,
content of the (B) cross-linked polymer particle being 30 parts by weight to 100 parts by weight with respect to the 100 parts by weight of the (A) binder polymer, and
the (B) cross-linked polymer particles having an average particle diameter of 1 μm to 10 μm.

2. The photosensitive resin composition as set forth in claim 1,
wherein the (A) binder polymer contains (A1) resin having a urethane bond in its molecule.

3. The photosensitive resin composition as set forth in claim 1,
wherein the (A) binder polymer contains (A2) resin having a (meth)acryloyl group in its molecule.

4. The photosensitive resin composition as set forth in claim 3,
wherein the content of the (B) cross-linked polymer particles is more than 50 parts by weight but 500 parts by weight or less with respect to 100 parts by weight of the (A2) resin having a (meth)acryloyl group in its molecule.

5. The photosensitive resin composition as set forth in claim 1,
wherein the (A) binder polymer contains (A3) resin which does not substantially have a (meth)acryloyl group in its molecule.

6. The photosensitive resin composition as set forth in claim 1,
wherein the (B) cross-linked polymer particles are cross-linked polymer particles containing an urethane bond in its molecule.

7. The photosensitive resin composition as set forth in claim 1,
wherein the (E) phosphoric flame retardant is phosphinate.

8. The photosensitive resin composition as set forth in claim 1,
wherein content of the (E) phosphoric flame retardant is 5 parts by weight to 100 parts by weight with respect to 100 parts by weight of the (A) binder polymer.

9. The photosensitive resin composition as set forth in claim 1,
wherein the content of the (B) cross-linked polymer particles is more than 50 parts by weight but 100 parts by weight or less with respect to 100 parts by weight of the (A) binder polymer.

10. The photosensitive resin composition as set forth in claim 1,
wherein the (A) binder polymer contains (A4) resin which does not substantially have a radical polymerizable group in its molecule and has a urethane bond and a carboxyl group in its molecule and (A5) resin which has a radical polymerizable group and a urethane bond in its molecule.

11. A photosensitive resin composition as set forth in claim 1, further comprising
(F) organic solvent,
wherein the (E) phosphoric flame retardant is a flame retardant which is not substantially soluble in the organic solvent.

12. A photosensitive resin composition as set forth in claim 1, further comprising
(G) coloring agent.

13. A resin film, prepared by applying, onto a surface of a base material, a photosensitive resin composition as recited in claim 1 and drying the photosensitive resin composition.

14. An insulating film prepared by curing the resin film as recited in claim 13.

15. A printed wiring board provided with an insulating film, comprising:
a printed wiring board; and
an insulating film as recited in claim 14, covering the printed wiring board.

16. A resin film, formed from a photosensitive resin composition as recited in claim 1.

17. An insulating film, formed from a photosensitive resin composition as recited in claim 1.

18. A printed wiring board provided with an insulating film, comprising:
a printed wiring board; and
an insulating film as recited in claim 17, covering the printed wiring board.

* * * * *